(12) United States Patent
Chang et al.

(10) Patent No.: US 12,040,312 B2
(45) Date of Patent: Jul. 16, 2024

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Chien-Wei Chang, Kaohsiung (TW); Shang-Wei Yeh, Kaohsiung (TW); Chung-Hsi Wu, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/893,037

(22) Filed: Aug. 22, 2022

(65) Prior Publication Data

US 2022/0399301 A1    Dec. 15, 2022

Related U.S. Application Data

(63) Continuation of application No. 16/514,966, filed on Jul. 17, 2019, now Pat. No. 11,424,212.

(51) Int. Cl.
*H01L 25/065* (2023.01)
*H01L 21/56* (2006.01)
(Continued)

(52) U.S. Cl.
CPC ........ *H01L 25/0652* (2013.01); *H01L 21/566* (2013.01); *H01L 21/76871* (2013.01); *H01L 23/3107* (2013.01); *H01L 23/3192* (2013.01); *H01L 24/09* (2013.01); *H01L 24/49* (2013.01); *H01L 24/85* (2013.01); *H01L 25/071* (2013.01); *H01L 25/112* (2013.01);
(Continued)

(58) Field of Classification Search
CPC . H01L 25/0652; H01L 25/071; H01L 25/112; H01L 25/162; H01L 25/042; H01L 25/043; H01L 25/0755; H01L 25/0756; H01L 23/3192
See application file for complete search history.

(56) References Cited

U.S. PATENT DOCUMENTS 5,373,189 A   12/1994 Massit et al.
6,627,983 B2   9/2003 Tu et al.
(Continued)

OTHER PUBLICATIONS

Final Office Action for U.S. Appl. No. 16/514,966, issued Apr. 26, 2021, 11 pages.
(Continued)

*Primary Examiner* — David A Zarneke
(74) *Attorney, Agent, or Firm* — FOLEY & LARDNER LLP

(57) ABSTRACT

A semiconductor package structure includes a conductive structure, at least one semiconductor element, an encapsulant, a redistribution structure and a plurality of bonding wires. The semiconductor element is disposed on and electrically connected to the conductive structure. The encapsulant is disposed on the conductive structure to cover the semiconductor element. The redistribution structure is disposed on the encapsulant, and includes a redistribution layer. The bonding wires electrically connect the redistribution structure and the conductive structure.

6 Claims, 36 Drawing Sheets

(51) Int. Cl.
  *H01L 21/768* (2006.01)
  *H01L 23/00* (2006.01)
  *H01L 23/31* (2006.01)
  *H01L 25/04* (2023.01)
  *H01L 25/07* (2006.01)
  *H01L 25/075* (2006.01)
  *H01L 25/11* (2006.01)
  *H01L 25/16* (2023.01)

(52) U.S. Cl.
  CPC .......... *H01L 25/042* (2013.01); *H01L 25/043* (2013.01); *H01L 25/0756* (2013.01); *H01L 25/162* (2013.01); *H01L 2224/02371* (2013.01)

(56) References Cited

U.S. PATENT DOCUMENTS

| | | | |
|---|---|---|---|
| 6,861,288 B2 | 3/2005 | Shim et al. | |
| 6,930,378 B1 | 8/2005 | St. Amand et al. | |
| 6,972,481 B2 | 12/2005 | Karnezos | |
| 7,288,835 B2 | 10/2007 | Yim et al. | |
| 7,354,800 B2 | 4/2008 | Carson | |
| 7,365,427 B2 | 4/2008 | Lu et al. | |
| 7,420,269 B2 | 9/2008 | Ha et al. | |
| 7,445,962 B2 | 11/2008 | Choi et al. | |
| 7,518,226 B2 | 4/2009 | Cablao et al. | |
| 7,674,640 B2 | 3/2010 | Ha et al. | |
| 7,772,685 B2 | 8/2010 | Huang et al. | |
| 7,902,638 B2 | 3/2011 | Do et al. | |
| 7,985,628 B2 | 7/2011 | Kuan et al. | |
| 8,022,555 B2* | 9/2011 | Hwang | H01L 24/97 257/773 |
| 8,063,477 B2 | 11/2011 | Pagaila et al. | |
| 8,102,666 B2 | 1/2012 | Park et al. | |
| 8,247,894 B2 | 8/2012 | Yoon et al. | |
| 8,258,015 B2 | 9/2012 | Chow et al. | |
| 8,487,420 B1 | 7/2013 | Hwang et al. | |
| 8,536,692 B2 | 9/2013 | Kuan et al. | |
| 8,642,382 B2 | 2/2014 | Kuan et al. | |
| 8,664,780 B2 | 3/2014 | Han et al. | |
| 8,686,570 B2* | 4/2014 | Semmelmeyer | H01L 24/97 257/737 |
| 8,766,429 B2 | 7/2014 | Kim | |
| 8,916,875 B2* | 12/2014 | Lee | H01L 25/03 257/686 |
| 8,999,754 B2 | 4/2015 | Chow et al. | |
| 9,064,838 B2 | 6/2015 | Ibrahim et al. | |
| 9,093,391 B2 | 7/2015 | Ahn et al. | |
| 10,109,617 B2 | 10/2018 | Lee et al. | |
| 10,373,940 B2 | 8/2019 | Lee | |
| 10,756,060 B2 | 8/2020 | Uchida et al. | |
| 2002/0148946 A1 | 10/2002 | Tu et al. | |
| 2004/0145039 A1 | 7/2004 | Shim et al. | |
| 2005/0090050 A1 | 4/2005 | Shim et al. | |
| 2007/0278696 A1 | 12/2007 | Lu et al. | |
| 2009/0051043 A1 | 2/2009 | Wong et al. | |
| 2010/0027233 A1 | 2/2010 | Low et al. | |
| 2010/0117244 A1 | 5/2010 | Miyagawa et al. | |
| 2010/0123234 A1 | 5/2010 | Chou | |
| 2013/0187292 A1* | 7/2013 | Semmelmeyer | H05K 1/11 257/E23.141 |
| 2014/0070428 A1 | 3/2014 | Tanimoto et al. | |
| 2014/0120662 A1* | 5/2014 | Onodera | H01L 24/48 438/108 |
| 2014/0312490 A1* | 10/2014 | Yang | H01L 25/03 257/737 |
| 2016/0343699 A1 | 11/2016 | Ng et al. | |
| 2017/0062387 A1 | 3/2017 | Hong et al. | |
| 2017/0294407 A1 | 10/2017 | Kim et al. | |
| 2018/0190622 A1 | 7/2018 | Lin et al. | |
| 2018/0350776 A1 | 12/2018 | Ye et al. | |
| 2019/0341369 A1 | 11/2019 | Chang Chien et al. | |
| 2020/0020613 A1 | 1/2020 | Kim | |
| 2020/0328187 A1 | 10/2020 | Cho et al. | |
| 2020/0343221 A1 | 10/2020 | Pon et al. | |

OTHER PUBLICATIONS

Final Office Action for U.S. Appl. No. 16/514,966, issued Dec. 27, 2021, 15 pages.
Final Office Action for U.S. Appl. No. 16/514,966, issued Jan. 14, 2022, 15 pages.
Non-Final Office Action for U.S. Appl. No. 16/514,966, issued Aug. 16, 2021, 13 pages.
Non-Final Office Action for U.S. Appl. No. 16/514,966, issued Nov. 16, 2020, 17 pages.
Notice of Allowance for U.S. Appl. No. 16/514,966, issued Apr. 1, 2022, 7 pages.

\* cited by examiner

SEMICONDUCTOR PACKAGE STRUCTURE AND METHOD FOR MANUFACTURING THE SAME

CROSS-REFERENCE TO RELATED APPLICATION

This application is a continuation of U.S. patent application Ser. No. 16/514,966 filed Jul. 17, 2019, now issued as U.S. Pat. No. 11,424,212, the contents of which is incorporated herein by reference in its entirety.

BACKGROUND

1. Field of the Disclosure

The present disclosure relates to a semiconductor package structure and a manufacturing method, and to a semiconductor package structure including a plurality of bonding wires for vertical electrical connection and a method for manufacturing the semiconductor package structure.

2. Description of the Related Art

In a comparative three dimensional (3D) stacked package structure, the stack connection between semiconductor elements is mainly through an adhesive. However, the adhesive has poor thermal conductivity, thus the heat generated by the semiconductor elements during operation may not readily dissipate through the adhesive. Furthermore, the adhesive cannot be used for electrical connection.

SUMMARY

In some embodiments, a semiconductor package structure includes a conductive structure, at least one semiconductor element, an encapsulant, a redistribution structure and a plurality of bonding wires. The semiconductor element is disposed on and electrically connected to the conductive structure. The encapsulant is disposed on the conductive structure to cover the semiconductor element. The redistribution structure is disposed on the encapsulant, and includes a redistribution layer. The bonding wires electrically connect the redistribution structure and the conductive structure.

In some embodiments, a semiconductor package structure includes a conductive structure, at least one first semiconductor element, a first encapsulant, a redistribution structure, at least one second semiconductor element and a second encapsulant. The first semiconductor element is disposed on and electrically connected to the conductive structure. The first encapsulant is disposed on the conductive structure to cover the first semiconductor element, and includes a plurality of encapsulant portions spaced apart from each other. The redistribution structure is disposed on the encapsulant portions of the first encapsulant, and includes a redistribution layer. The second semiconductor element is disposed on and electrically connected to the redistribution structure. The second encapsulant is disposed on the redistribution structure to cover at least a portion of the second semiconductor element and in direct contact with the encapsulant portions of the first encapsulant.

In some embodiments, a method for manufacturing a semiconductor package structure includes: (a) providing a conductive structure with at least one first semiconductor element disposed thereon; (b) forming a first encapsulant on the conductive structure to cover the first semiconductor element; (c) forming a plurality of redistribution structures on the first encapsulant; (d) etching the first encapsulant to form a plurality of encapsulant portions spaced apart from each other and at least one opening between the encapsulant portions; (e) disposing at least one second semiconductor element on the redistribution structure and electrically connecting the redistribution structure and the conductive structure through a plurality of bonding wires; and (f) forming a second encapsulant on the redistribution structure to cover at least a portion of the second semiconductor element and in the opening to cover the bonding wires and in direct contact with the encapsulant portions of the first encapsulant.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
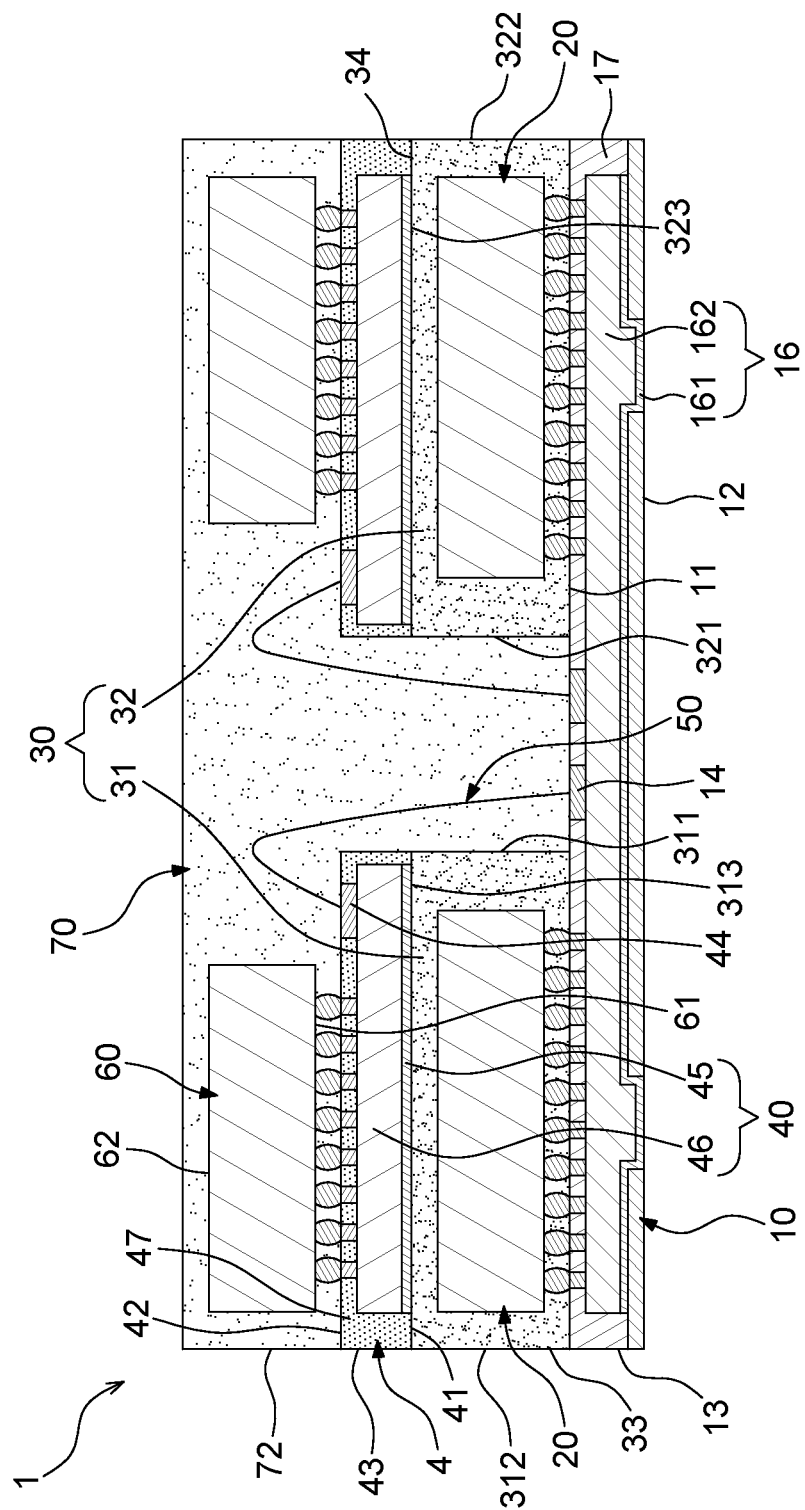
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative semiconductor package structure, semiconductor elements are stacked through an interposer. However, an adhesive is still included to bond the interposer and the semiconductor element, and the poor thermal conductivity of the adhesive may result in reduced heat dissipation of the interposer. In addition, the use of the interposer may cause an increase of the whole thickness of the semiconductor package structure since the interposer is too thick.

At least some embodiments of the present disclosure provide for a semiconductor package structure which has improved heat dissipation and reduced thickness. In some embodiments, the semiconductor package structure includes a redistribution structure disposed on an encapsulant and between semiconductor elements. At least some embodiments of the present disclosure further provide for techniques for manufacturing the semiconductor package structure.

FIG. 1 illustrates a cross-sectional view of a semiconductor package structure 1 according to some embodiments of the present disclosure. The semiconductor package structure 1 includes a conductive structure 10, at least one first semiconductor element 20, a first encapsulant 30, a redistribution structure 4, a plurality of bonding wires 50, at least one second semiconductor element 60 and a second encapsulant 70. In some embodiments, the semiconductor package structure 1 may be a three dimensional (3D) stacked semiconductor package structure.

The conductive structure 10 has a top surface 11, a bottom surface 12 opposite to the top surface 11 and a peripheral surface 13 extending between the top surface 11 and the bottom surface 12, and includes a dielectric structure 17, a circuit layer 16 and a plurality of wire bonding pads 14. The dielectric structure 17 may include one or more dielectric layers made of a cured photoimageable dielectric (PID) material such as epoxy or polyimide (PI) including photoinitiators. The circuit layer 16 is embedded in the dielectric structure 17. In some embodiments, the circuit layer 16 includes a seed layer 161 adjacent to the bottom surface 12 and a metal layer 162 disposed on the seed layer 161. A portion of the seed layer 161 of the circuit layer 16 may be exposed from the bottom surface of the dielectric structure 17 (e.g., the bottom surface 12 of the conductive structure 10) for external connection. The wire bonding pads 14 are disposed on the metal layer 162 of the circuit layer 16, and are in proximity to, adjacent to or embedded in and exposed from the top surface of the dielectric structure 17 (e.g., the top surface 11 of the conductive structure 10). In some embodiments, the conductive structure 10 may be formed from a fan-out wafer.

The first semiconductor element 20 may be, for example, a semiconductor die or a semiconductor chip. The first semiconductor element 20 is disposed on and electrically connected to the top surface 11 of the conductive structure 10. For example, the first semiconductor element 20 may be bonded to the top surface 11 of the conductive structure 10 by flip chip bonding. As shown in FIG. 1, the semiconductor package structure 1 includes two first semiconductor elements 20 disposed side by side. The sizes and functions of the first semiconductor elements 20 may be same as or different from each other.

The first encapsulant 30 is disposed on the conductive structure 10, and a material of the first encapsulant 30 may be a molding compound with or without fillers. The first encapsulant 30 may cover the first semiconductor element(s) 20 and a portion of the top surface 11 of the conductive structure 10. The first encapsulant 30 has a top surface 34 and a peripheral surface 33, and includes a plurality of encapsulant portions (e.g., a first encapsulant portion 31 and a second encapsulant portion 32) spaced apart from each other. For example, the first encapsulant 30 includes a first encapsulant portion 31 and a second encapsulant portion 32 spaced apart from the first encapsulant portion 31. The first encapsulant portion 31 and the second encapsulant portion 32 cover the first semiconductor elements 20 and the portion of the top surface 11 of the conductive structure 10. In some embodiments, the first encapsulant portion 31 and the second encapsulant portion 32 are formed concurrently. The peripheral surface 13 of the conductive structure 10 may be substantially coplanar with the peripheral surface 33 of the first encapsulant 30. The wire bonding pads 14 of the conductive structure 10 may be disposed or located between the first encapsulant portion 31 and the second encapsulant portion 32 of the first encapsulant 30.

The first encapsulant portion 31 includes an inner lateral surface 311, an outer lateral surface 312 opposite to the inner lateral surface 311 and an upper surface 313 extended between the inner lateral surface 311 and the outer lateral surface 312. The second encapsulant portion 32 includes an inner lateral surface 321 facing the inner lateral surface 311 of the first encapsulant portion 31, an outer lateral surface 322 opposite to the inner lateral surface 321 and an upper surface 323 extended between the inner lateral surface 321 and the outer lateral surface 322. In some embodiments, the top surface 34 of the first encapsulant 30 may include the upper surface 313 of the first encapsulant portion 31 and the upper surface 323 of the second encapsulant portion 32, and the peripheral surface 33 of the first encapsulant 30 may include the outer lateral surface 312 of the first encapsulant portion 31 and the outer lateral surface 322 of the second encapsulant portion 32. A height of the first encapsulant portion 31 may be substantially equal to a height of the second encapsulant portion 32.

The redistribution structure 4 is disposed on the first encapsulant 30, for example, the redistribution structure 4 is disposed on the first encapsulant portion 31 and the second encapsulant portion 32. The redistribution structure 4 has a first surface 41 facing the first encapsulant 30 (e.g., facing the first encapsulant portion 31 and the second encapsulant portion 32), a second surface 42 opposite to the first surface 41 and a peripheral surface 43 extending between the first surface 41 and the second surface 42. The redistribution structure 4 includes a dielectric structure 47, a redistribution layer 40 and a plurality of wire bonding pads 44. The dielectric structure 47 may include one or more dielectric layers made of a cured photoimageable dielectric (PID) material such as epoxy or polyimide (PI) including photoinitiators. The redistribution layer 40 is embedded in the dielectric structure 47 and includes a seed layer 45 disposed on the top surface 34 of the first encapsulant 30 (e.g., including the upper surface 313 of the first encapsulant portion 31 and the upper surface 323 of the second encapsulant portion 32) and a metal layer 46 disposed on the seed layer 45. In some embodiments, the seed layer 45 of the redistribution structure 4 is formed on or contacts the top surface 34 of the first encapsulant 30 (e.g., including the upper surface 313 of the first encapsulant portion 31 and the upper surface 323 of the second encapsulant portion 32) directly.

The wire bonding pads 44 may be disposed on and electrically connected to the redistribution layer 40, and may be in proximity to, adjacent to or embedded in and exposed from the top surface of the dielectric structure 47 (e.g., the second surface 42 of the redistribution structure 4). In some embodiments, the peripheral surface 43 of the redistribution structure 4 may be substantially coplanar with the peripheral surface 33 of the first encapsulant 30 and the peripheral surface 13 of the conductive structure 10.

The bonding wires 50 electrically connect the redistribution structure 4 and the conductive structure 10. For example, the wire bonding pads 44 of the redistribution structure 4 may be electrically connected to the corresponding wire bonding pads 14 of the conductive structure 10 through the bonding wires 50. In some embodiments, a portion of each of the bonding wires 50 may be disposed between the first encapsulant portion 31 and the second encapsulant portion 32 of the first encapsulant 30.

The second semiconductor element 60 may be, for example, a semiconductor die or a semiconductor chip. The second semiconductor element 60 is disposed on and electrically connected to the second surface 42 of the redistribution structure 4. For example, the second semiconductor element 60 is bonded to the second surface 42 of the redistribution structure 4 by flip chip bonding. The second semiconductor element 60 has a bottom surface 61 facing the redistribution structure 4 and a top surface 62 opposite to the bottom surface 61. As shown in FIG. 1, the semiconductor package structure 1 includes two second semiconductor elements 60. The sizes and functions of the second semiconductor elements 60 may be same as or different from each other.

The second encapsulant 70 is disposed on the redistribution structure 4, and a material of the second encapsulant 70 may be a molding compound with or without fillers. The second encapsulant 70 may cover at least a portion of the second semiconductor element 60, the wire bonding pads 44 of the redistribution structure 4, the bonding wires 50 and the wire bonding pads 14 of the conductive structure 10, and in direct contact with the first encapsulant portion 31 and the second encapsulant portion 32 of the first encapsulant 30. In some embodiments, the second encapsulant 70 is in direct contact with the inner lateral surface 311 of the first encapsulant portion 31 and the inner lateral surface 321 of the second encapsulant portion 32. In some embodiments, the top surface 62 of the second semiconductor element 60 may be covered by the second encapsulant 70.

In some embodiments, a cross-section of the second encapsulant 70 is in a T-shape. A peripheral surface 72 of the second encapsulant 70 may be substantially coplanar with the peripheral surface 43 of the redistribution structure 4 and the peripheral surface 33 of the first encapsulant 30.

Due to the stack connection between the first semiconductor element 20 and the second semiconductor element 60 is through the redistribution structure 4, the heat generated by the first semiconductor element 20 and the second semiconductor element 60 during operation may easy to dissipate through the redistribution structure 4, e.g., a heat dissipation of the redistribution structure 4 is more efficient than a heat dissipation of the interposer together with the adhesive of the comparative example described herein. In addition, the redistribution structure 4 is thinner than the interposer and the adhesive of the comparative example, thus a whole thickness of the semiconductor package structure 1 may be reduced.

Figure 2:
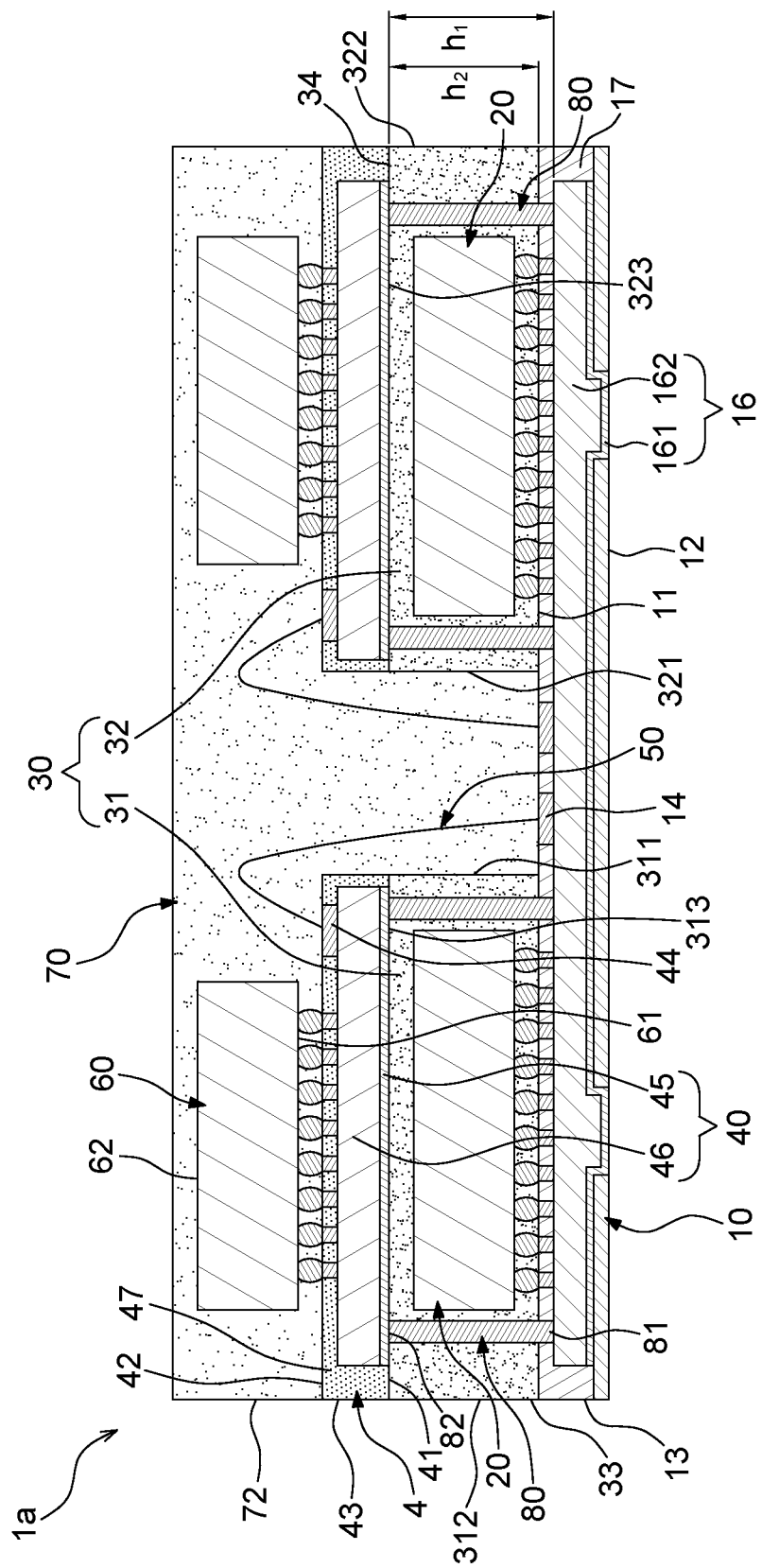
FIG. 2 illustrates a cross-sectional view of a semiconductor package structure according to some embodiments of the present disclosure.

FIG. 2 illustrates a cross-sectional view of a semiconductor package structure 1a according to some embodiments of the present disclosure. The semiconductor package structure 1a is similar to the semiconductor package structure 1 shown in FIG. 1, except that the semiconductor package structure 1a further includes a plurality of pillars 80 disposed around the first semiconductor element 20. The pillars 80 electrically connect the redistribution structure 4 and the conductive structure 10. When some of the bonding wires 50 occur fail connections, the pillars 80 may maintain a good connection between the redistribution structure 4 and the conductive structure 10. Each of the pillars 80 has a first end 81 connected to the circuit layer 16 of the conductive structure 10 and a second end 82 opposite to the first end 81 and exposed from the top surface 34 of the first encapsulant 30 (e.g., including the first encapsulant portion 31 and the second encapsulant portion 32). The seed layer 45 of the redistribution layer 40 may be disposed on the second end 82 of each of the pillars 80. The first encapsulant 30 (e.g., including the first encapsulant portion 31 and the second encapsulant portion 32) may cover the pillars 80. In some embodiments, a height $h_1$ of each of the pillars 80 may be greater than or equal to a height $h_2$ of the first encapsulant 30.

Figure 3:
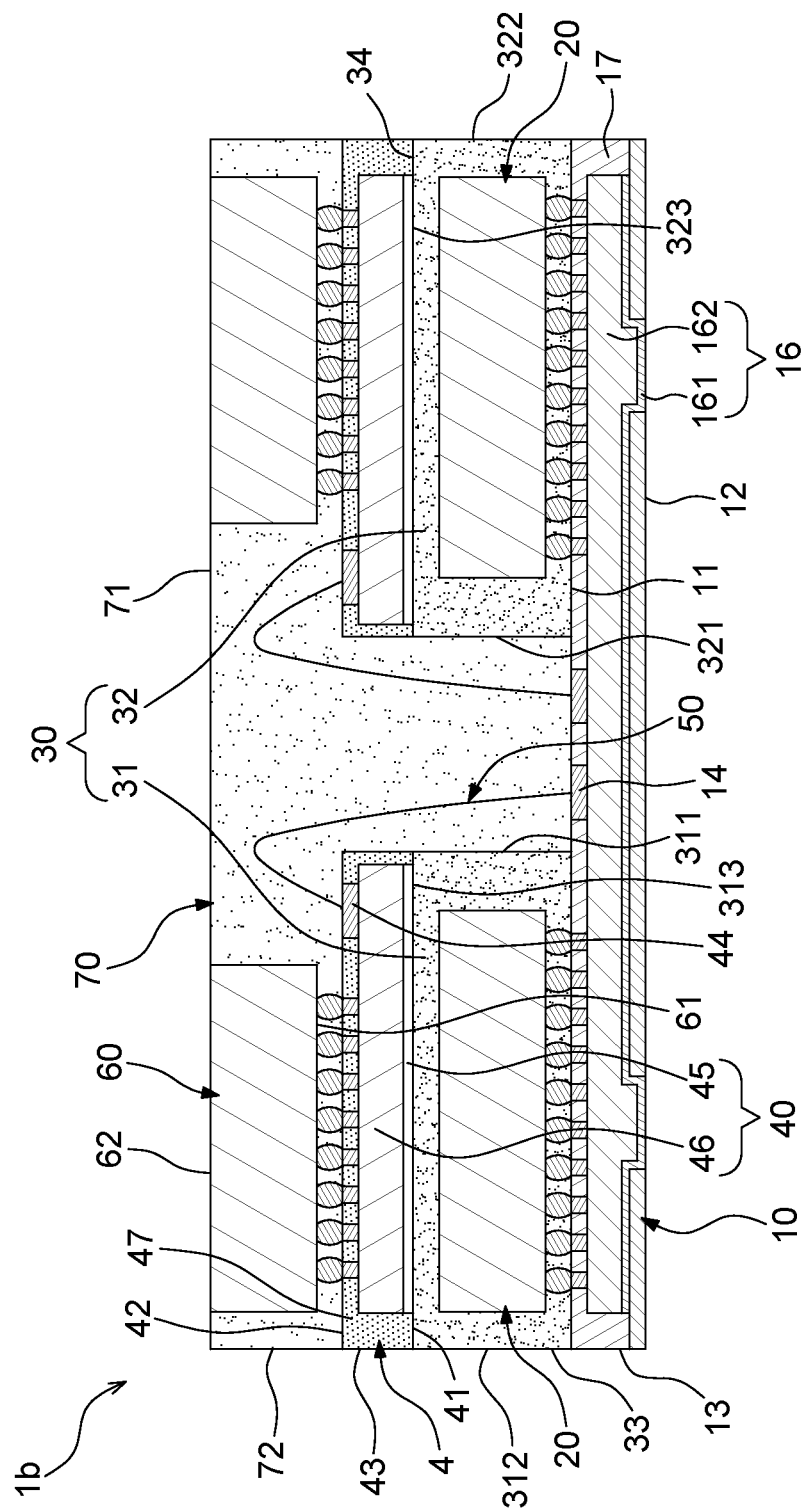
FIG. 3 illustrates a cross-sectional view of a semiconductor package structure according to some embodiments of the present disclosure.

FIG. 3 illustrates a cross-sectional view of a semiconductor package structure 1b according to some embodiments of the present disclosure. The semiconductor package structure 1b is similar to the semiconductor package structure 1 shown in FIG. 1, except for the configuration of the second semiconductor element 60. The top surface 62 of the second semiconductor element 60 may be exposed from a top surface 71 of the second encapsulant 70. That is, the top surface 62 of the second semiconductor element 60 may not be covered by the second encapsulant 70 to improve a heat dissipation of the second semiconductor element 60. In some embodiments, the top surface 62 of the second semiconductor element 60 may be substantially coplanar with the top surface 71 of the second encapsulant 70.

Figure 4:
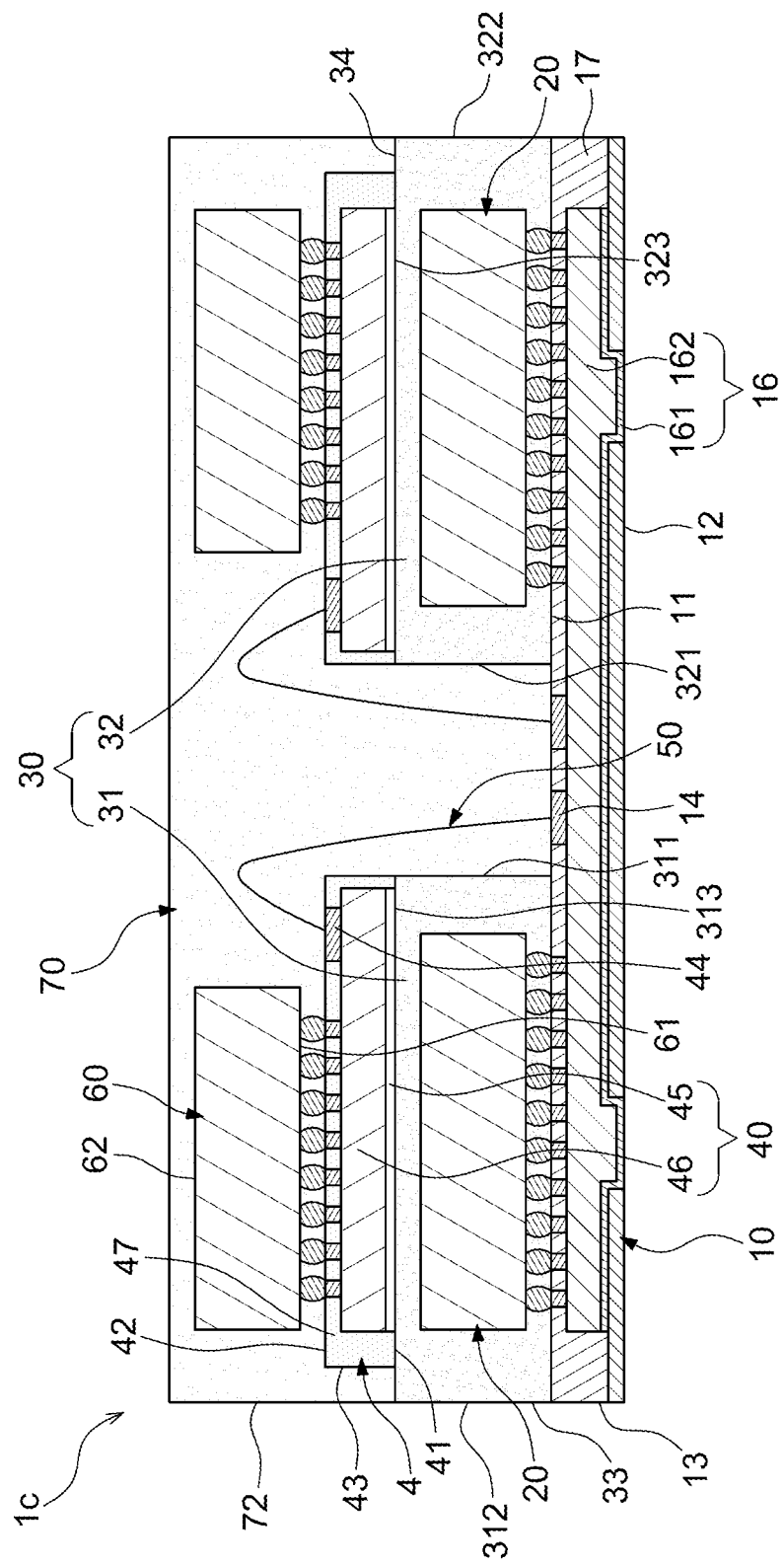
FIG. 4 illustrates a cross-sectional view of a semiconductor package structure according to some embodiments of the present disclosure.

FIG. 4 illustrates a cross-sectional view of a semiconductor package structure 1c according to some embodiments of the present disclosure. The semiconductor package structure 1c is similar to the semiconductor package structure 1 shown in FIG. 1, except for the configuration of the second encapsulant 70. The second encapsulant 70 may be in direct contact with the top surface 34 of the first encapsulant 30. The peripheral surface 72 of the second encapsulant 70 may be substantially coplanar with the peripheral surface 33 of the first encapsulant 30 (e.g., including the first encapsulant portion 31 and the second encapsulant portion 32). In some embodiments, the peripheral surface 43 of the redistribution structure 4 may be non-coplanar with the peripheral surface 72 of the second encapsulant 70 and the peripheral surface 33 of the first encapsulant 30.

Figure 5:
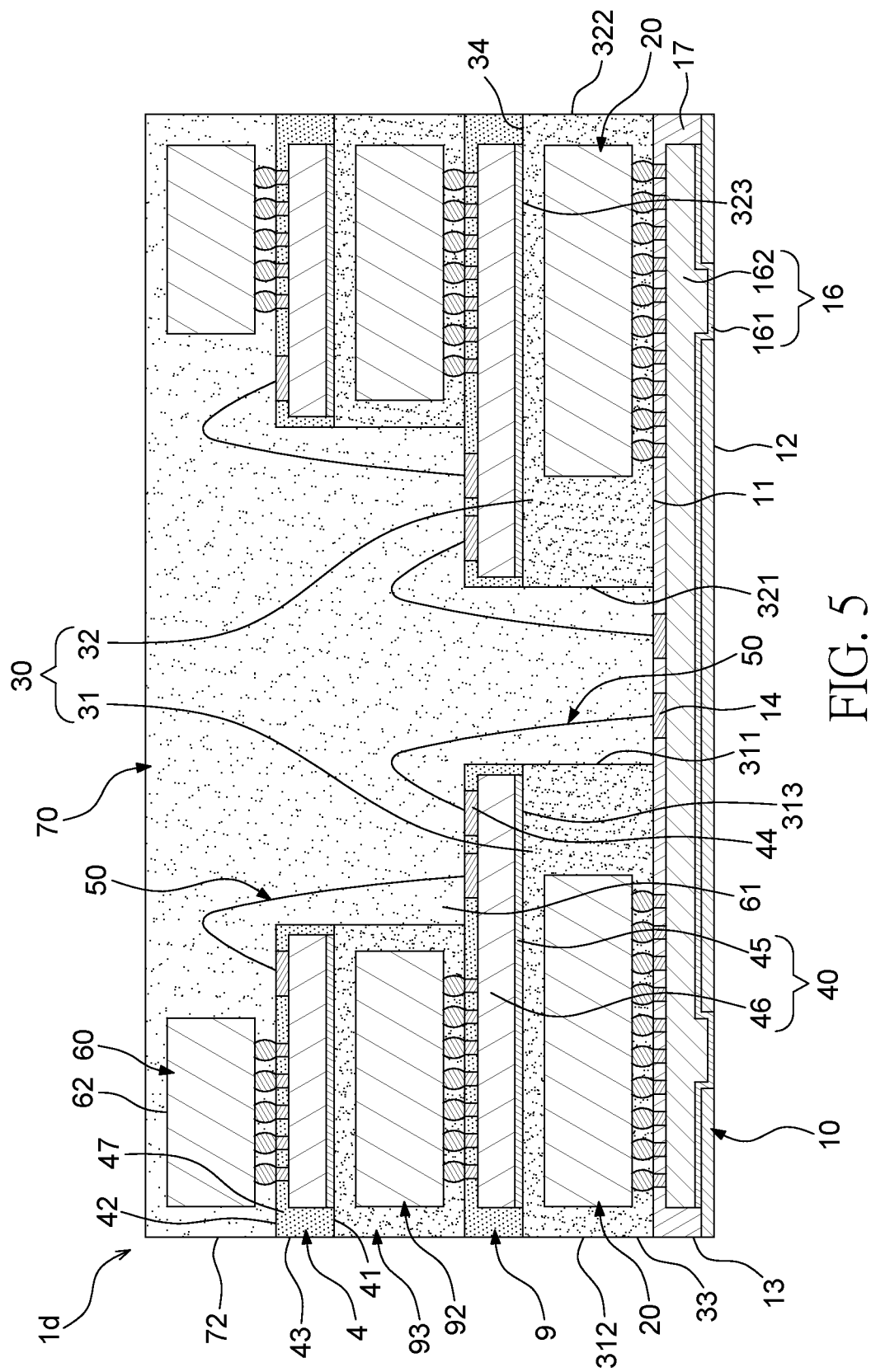
FIG. 5 illustrates a cross-sectional view of a semiconductor package structure according to some embodiments of the present disclosure.

FIG. 5 illustrates a cross-sectional view of a semiconductor package structure 1d according to some embodiments of the present disclosure. The semiconductor package structure 1d is similar to the semiconductor package structure 1 shown in FIG. 1, except that the semiconductor package structure 1d further includes at least one intermediate redistribution structure 9 interposed between the first encapsulant 30 and the redistribution structure 4, at least one intermediate semiconductor element 92 disposed on and electrically connected to the intermediate redistribution structure 9, and at least one intermediate encapsulant 93 disposed between the intermediate redistribution structure 9 and the redistribution structure 4 to cover the intermediate semiconductor element 92. The intermediate redistribution structure 9 may be the same as, or similar to, the redistribution structure 4 shown in FIG. 1. The intermediate redistribution structure 9 may be electrically connected to the redistribution structure 4 and the conductive structure 10 through the bonding wires 50.

Figure 6:
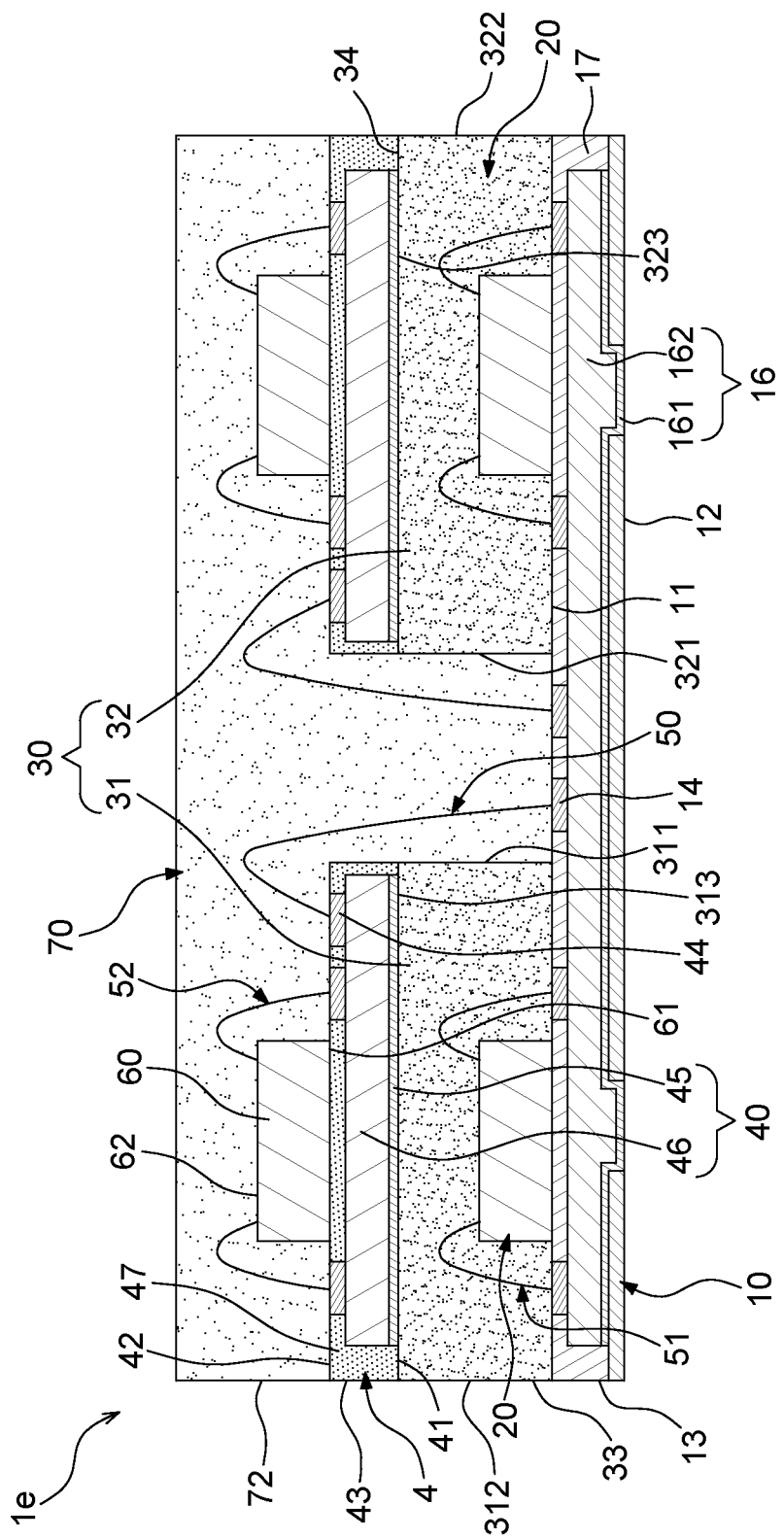
FIG. 6 illustrates a cross-sectional view of a semiconductor package structure according to some embodiments of the present disclosure.

FIG. 6 illustrates a cross-sectional view of a semiconductor package structure 1e according to some embodiments of the present disclosure. The semiconductor package structure 1e is similar to the semiconductor package structure 1 shown in FIG. 1, except for the bonding manner between the first semiconductor element 20 and the conductive structure 10 and the bonding manner between the second semiconductor element 60 and the redistribution structure 4. In the semiconductor package structure 1e, the first semiconductor element 20 is bonded to the conductive structure 10 by wire bonding, and the second semiconductor element 60 is bonded to the redistribution structure 4 by wire bonding. That is, the first semiconductor element 20 is electrically connected to the conductive structure 10 through a plurality of bonding wires 51, and the second semiconductor element 60 is electrically connected to the redistribution structure 4 through a plurality of bonding wires 52.

Figure 7:
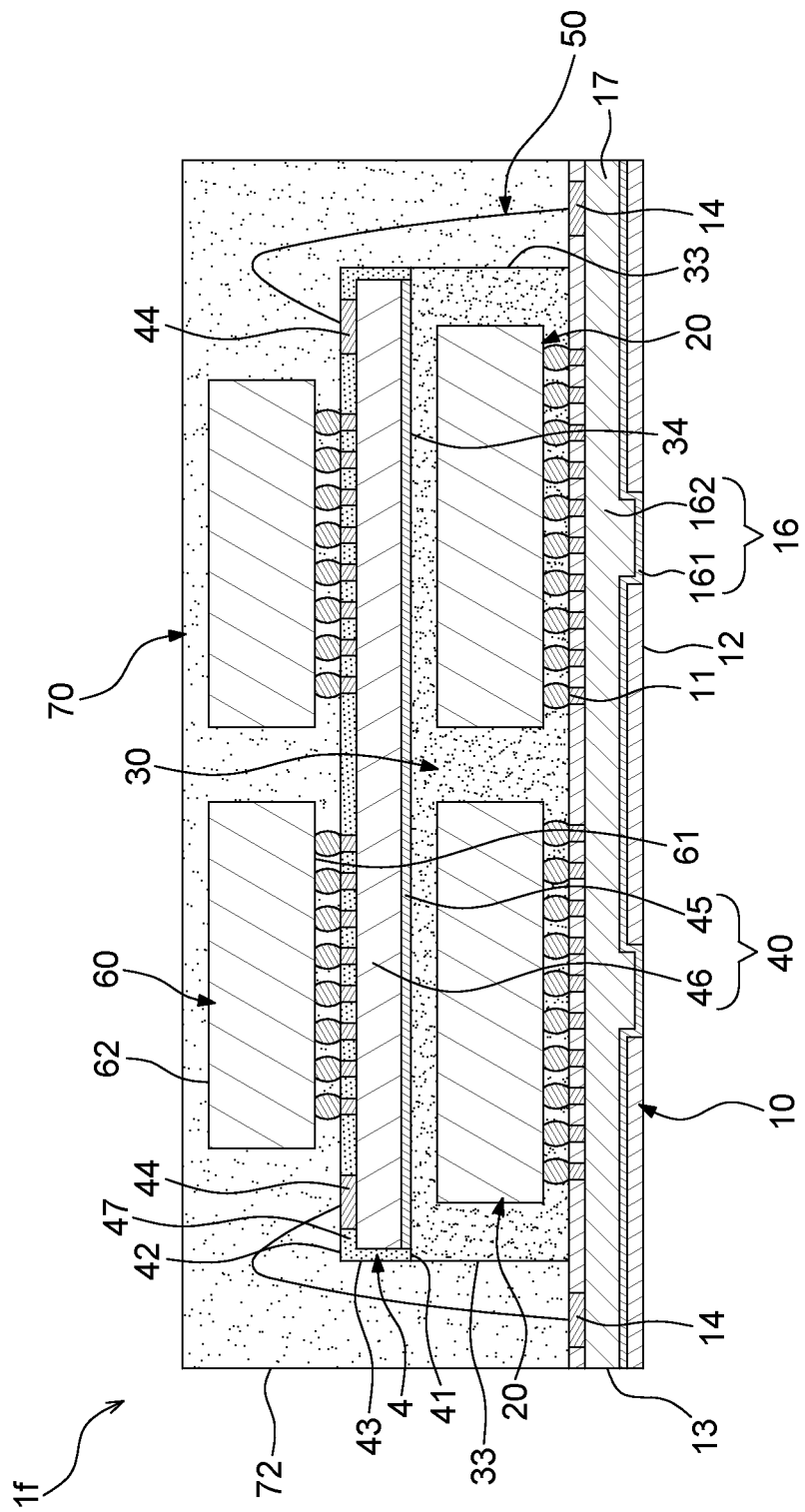
FIG. 7 illustrates a cross-sectional view of a semiconductor package structure according to some embodiments of the present disclosure.

FIG. 7 illustrates a cross-sectional view of a semiconductor package structure 1f according to some embodiments of the present disclosure. The semiconductor package structure 1f is similar to the semiconductor package structure 1 shown in FIG. 1, except for the configurations of the wire bonding pads 14 of the conductive structure 10 and the wire bonding pads 44 of the redistribution structure 4. The wire bonding pads 14 of the conductive structure 10 may be located at two sides of the first encapsulant 30. The configuration of the wire bonding pads 44 of the redistribution structure 4 may be the same as, or similar to, the configuration of the wire bonding pads 14 of the conductive structure 10. Therefore, the wire bonding pads 44 of the redistribution structure 4 may be electrically connected to the corresponding wire bonding pads 14 of the conductive structure 10 through the bonding wires 50.

Figure 8:
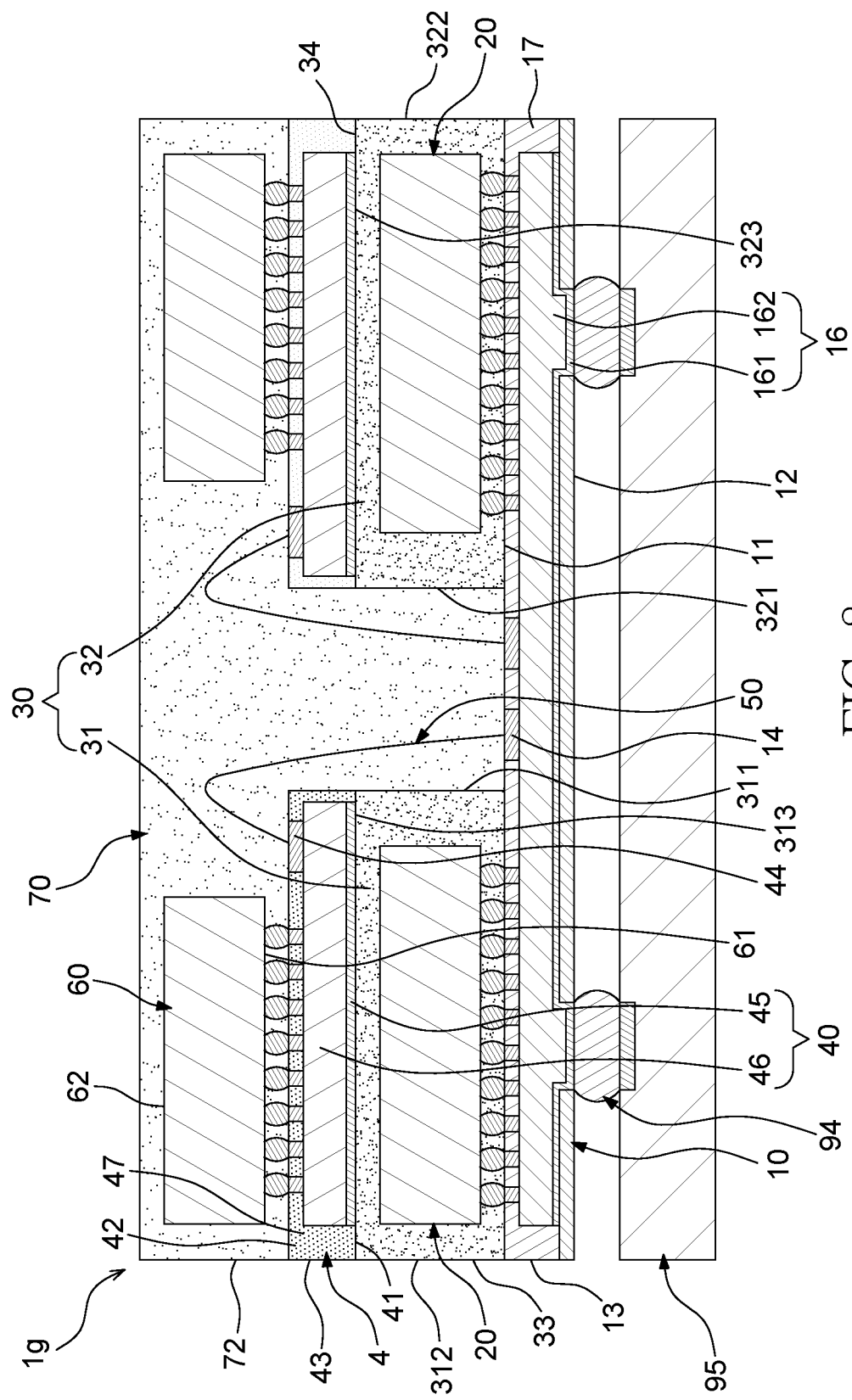
FIG. 8 illustrates a cross-sectional view of a semiconductor package structure according to some embodiments of the present disclosure.

FIG. 8 illustrates a cross-sectional view of a semiconductor package structure 1g according to some embodiments of the present disclosure. The semiconductor package structure 1g is similar to the semiconductor package structure 1 shown in FIG. 1, except that the semiconductor package structure 1g further includes a plurality of solder bumps 94 disposed on the conductive structure 10 and a substrate 95. The solder bumps 94 may be electrically connected to the substrate 95.

Figure 9:
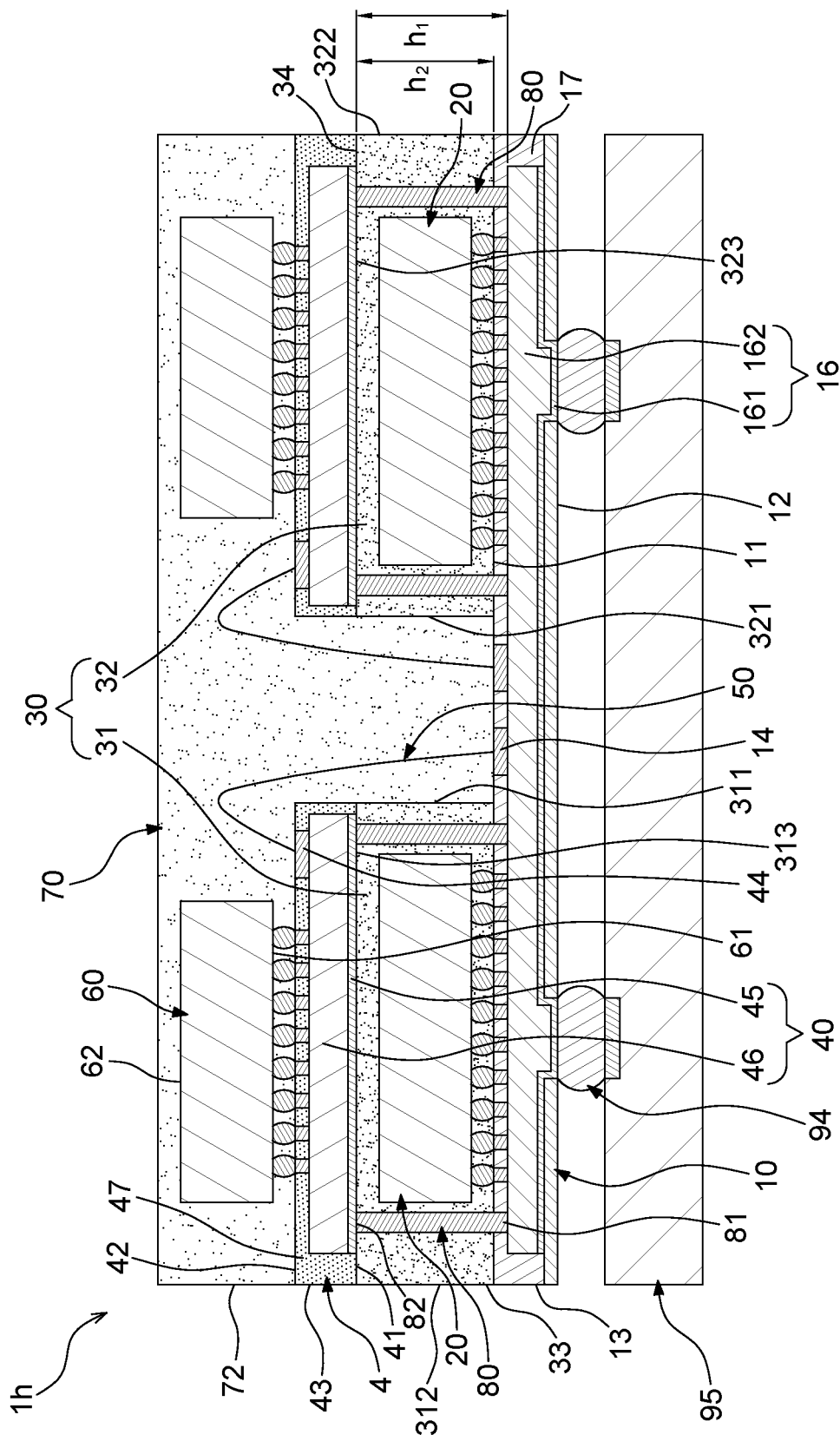
FIG. 9 illustrates a cross-sectional view of a semiconductor package structure according to some embodiments of the present disclosure.

FIG. 9 illustrates a cross-sectional view of a semiconductor package structure 1h according to some embodiments of the present disclosure. The semiconductor package structure 1h is similar to the semiconductor package structure 1a shown in FIG. 2, except that the semiconductor package structure 1h further includes a plurality of solder bumps 94 disposed on the conductive structure 10 and a substrate 95. The solder bumps 94 may be electrically connected to the substrate 95.

FIG. 10 through FIG. 24 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 10:
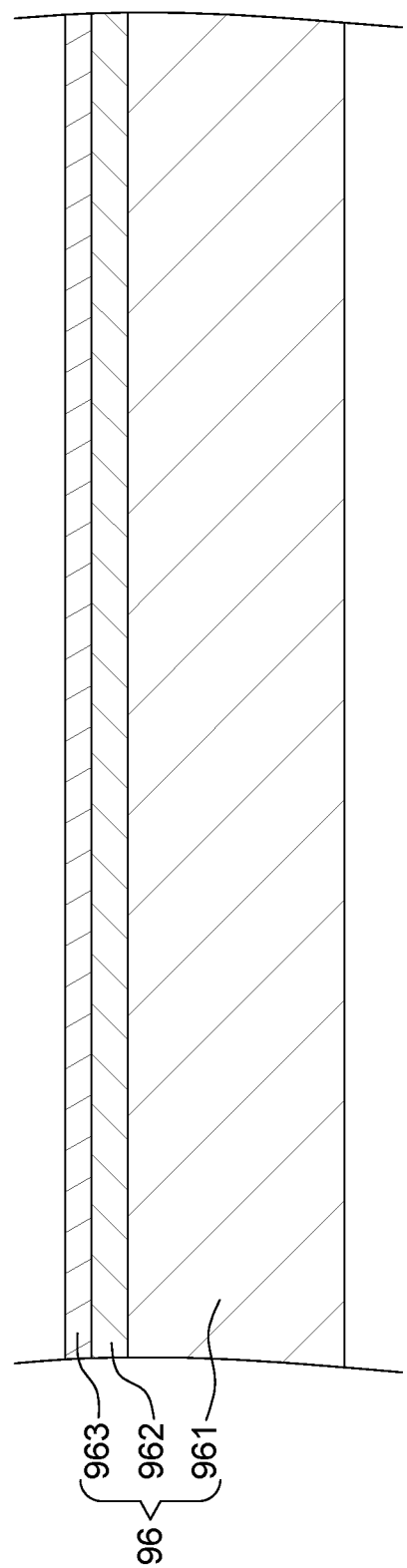
FIG. 10 illustrates one or more stages of an example of a method for manufacturing a semiconductor package structure according to some embodiments of the present disclosure.

Referring to FIG. 10, a carrier structure 96 is provided. The carrier structure 96 includes a carrier body 961, a release layer 962 formed on the carrier body 961 and a seed layer 963 formed on the release layer 962. In some embodiments, the seed layer 963 may be formed by physical vapor deposition (PVD).

Figure 11:
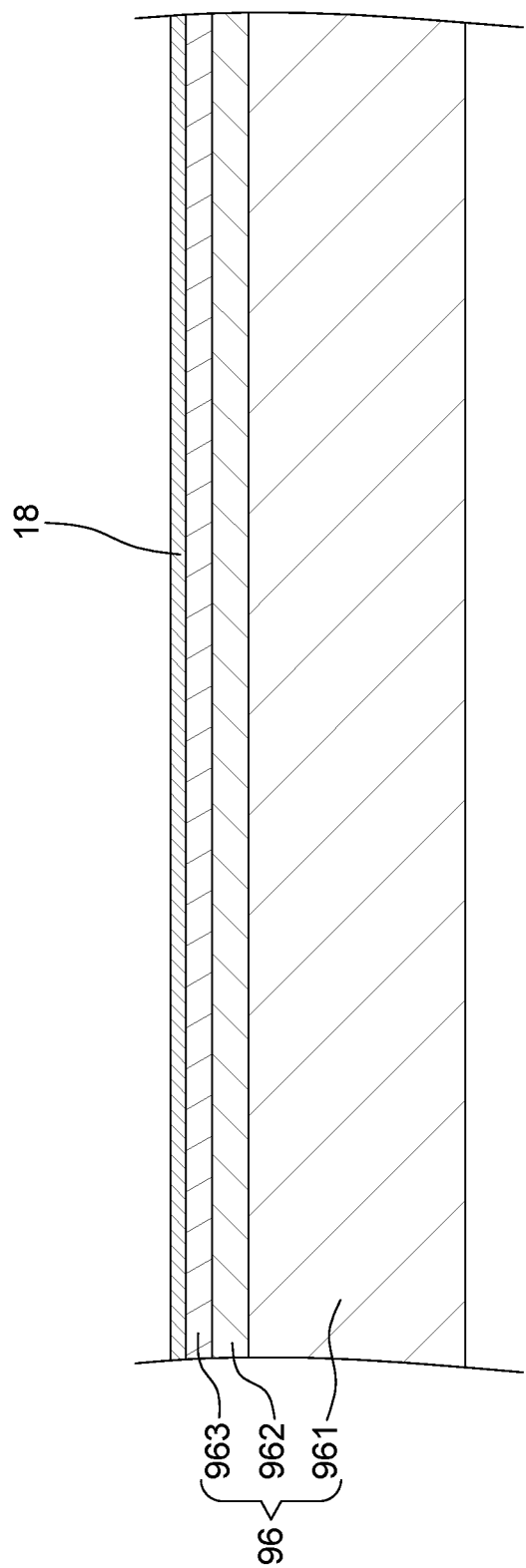
FIG. 11 illustrates one or more stages of an example of a method for manufacturing a semiconductor package structure according to some embodiments of the present disclosure.

Referring to FIG. 11 through FIG. 17, a conductive structure 10 is formed or disposed on the carrier structure 96. Referring to FIG. 11, an insulating layer 18 is formed or disposed on the seed layer 963 of the carrier structure 96 by, for example, coating. A material of the insulating layer 18 may include an insulating material, a passivation material, a dielectric material or a solder resist material, such as, for example, a benzocyclobutene (BCB) based polymer or a polyimide (PI).

Figure 12:
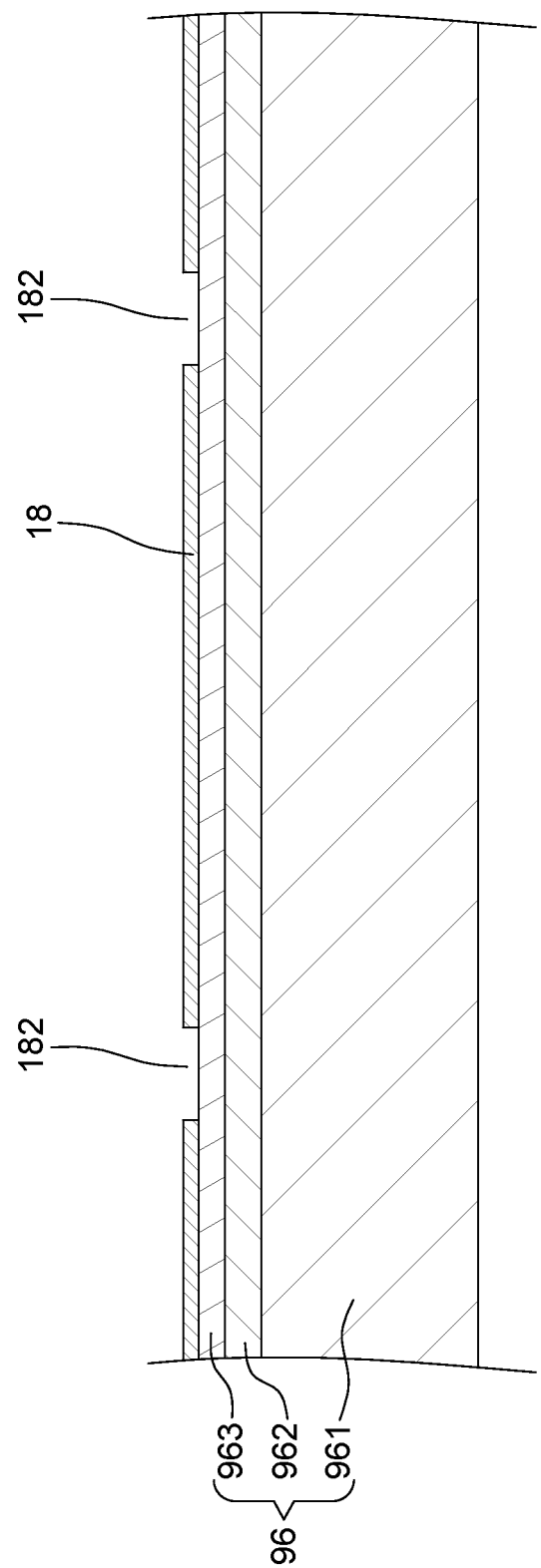
FIG. 12 illustrates one or more stages of an example of a method for manufacturing a semiconductor package structure according to some embodiments of the present disclosure.

Referring to FIG. 12, portions of the insulating layer 18 are removed by, for example, photolithography, to form a plurality of openings 182 to expose portions of the seed layer 963. The openings 182 extends through the insulating layer 18.

Figure 13:
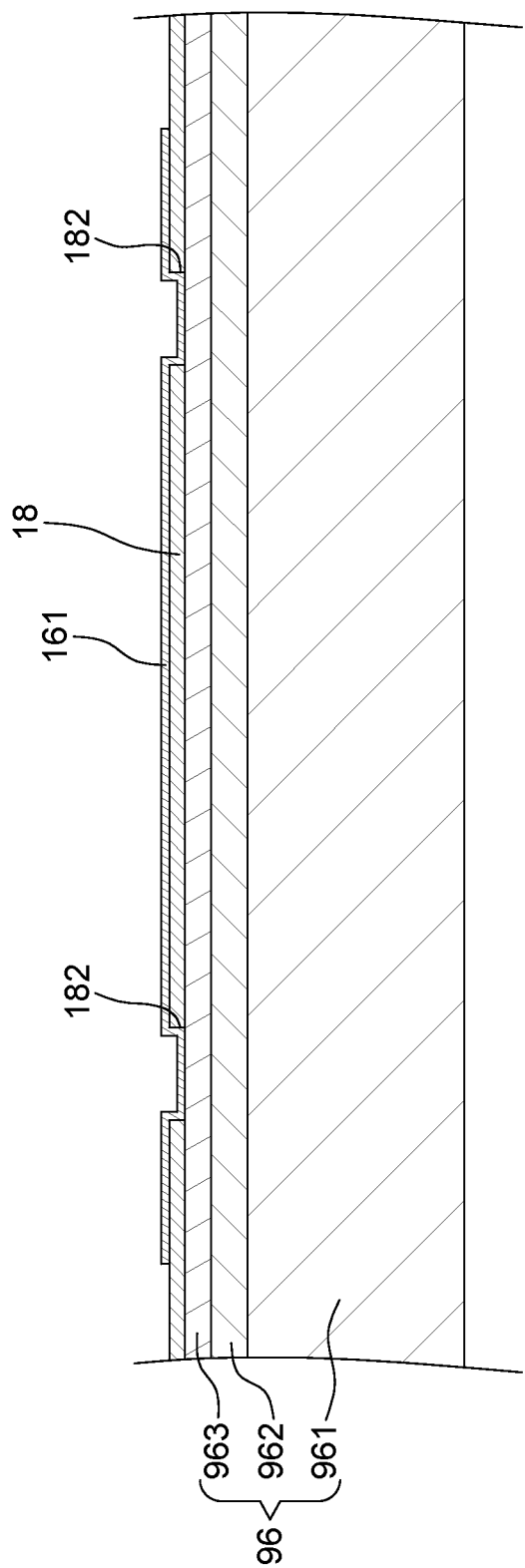
FIG. 13 illustrates one or more stages of an example of a method for manufacturing a semiconductor package structure according to some embodiments of the present disclosure.

Referring to FIG. 13, a seed layer 161 is formed or disposed on the insulating layer 18, in the openings 182 and on the exposed portions of the seed layer 963. In some embodiments, the seed layer 161 may be formed by physical vapor deposition (PVD).

Figure 14:
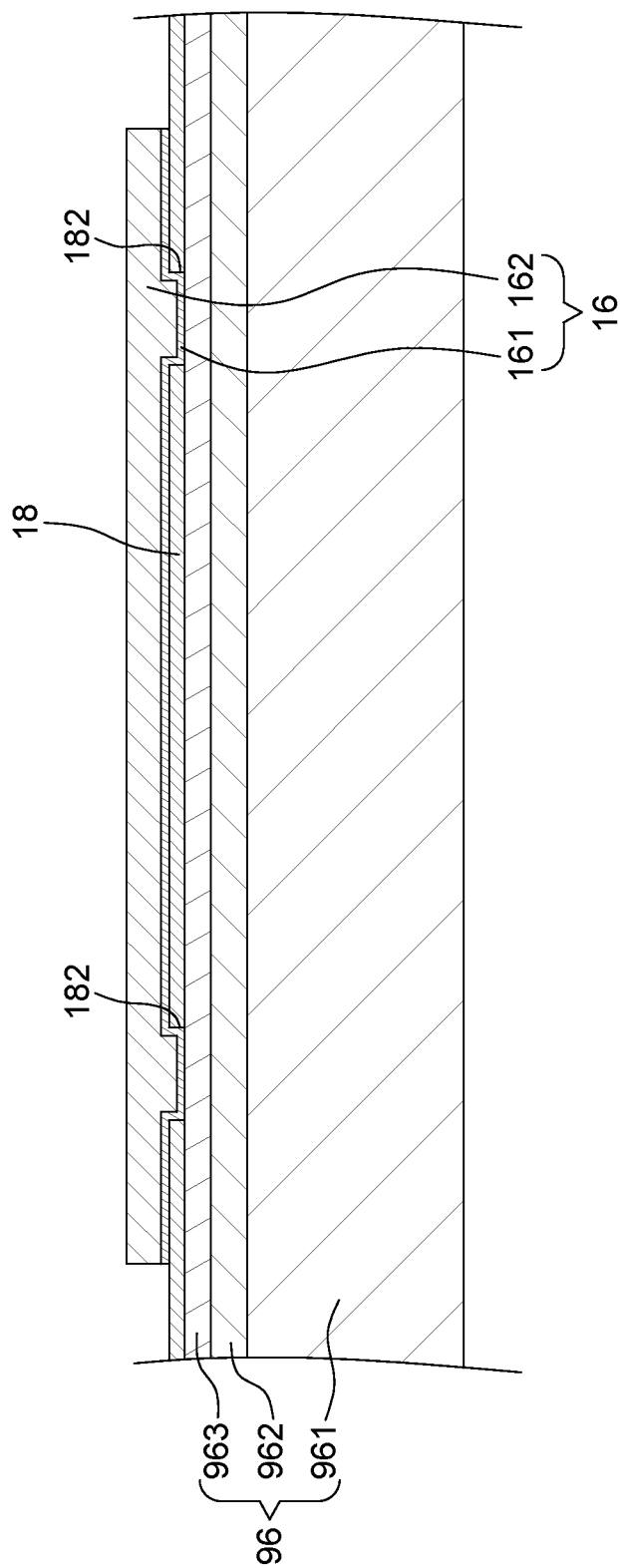
FIG. 14 illustrates one or more stages of an example of a method for manufacturing a semiconductor package structure according to some embodiments of the present disclosure.

Referring to FIG. 14, a metal layer 162 is formed or disposed on the seed layer 161. The metal layer 162 may be a patterned circuit structure. Thus, the metal layer 162 and the seed layer 161 may constitute a circuit layer 16.

Figure 15:
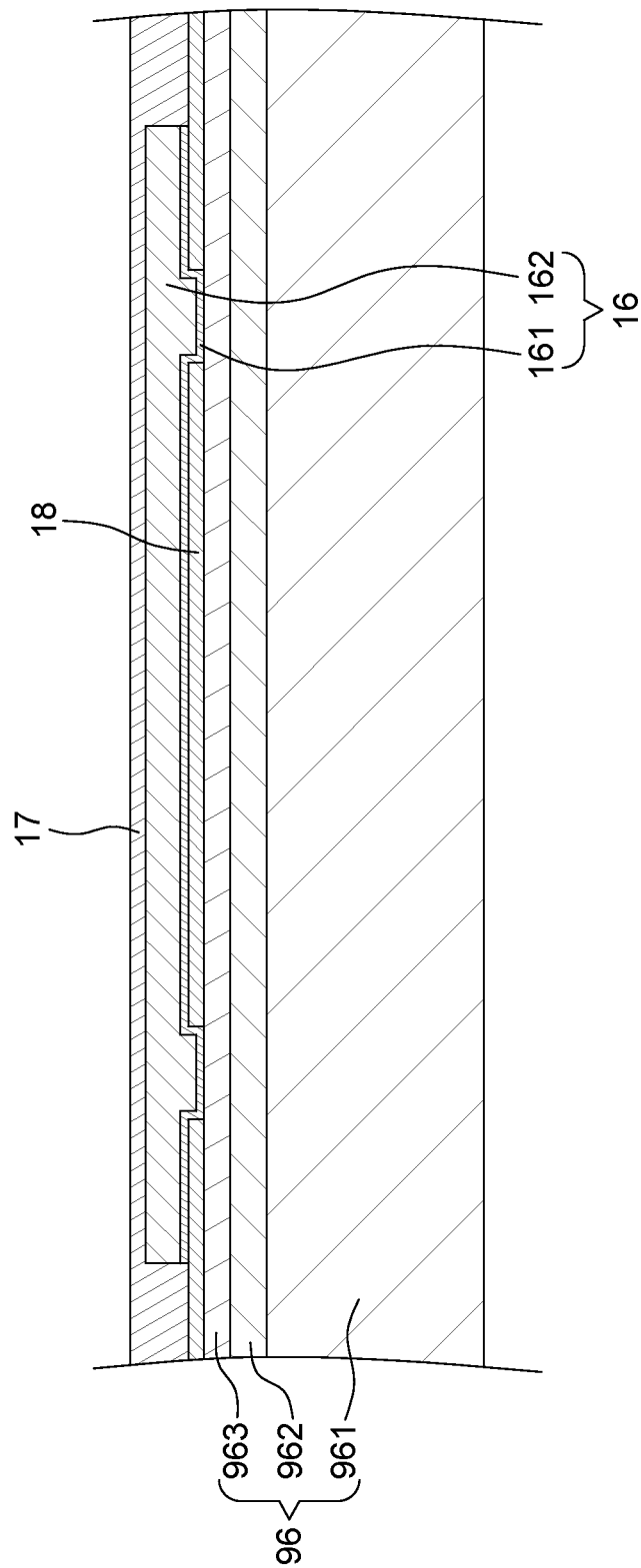
FIG. 15 illustrates one or more stages of an example of a method for manufacturing a semiconductor package structure according to some embodiments of the present disclosure.

Referring to FIG. 15, a dielectric structure 17 is formed to cover the circuit layer 16 and the insulating layer 18 by, for example, coating. The dielectric structure 17 may include one or more dielectric layers made of a cured photoimageable dielectric (PID) material such as epoxy or polyimide (PI) including photoinitiators.

Figure 16:
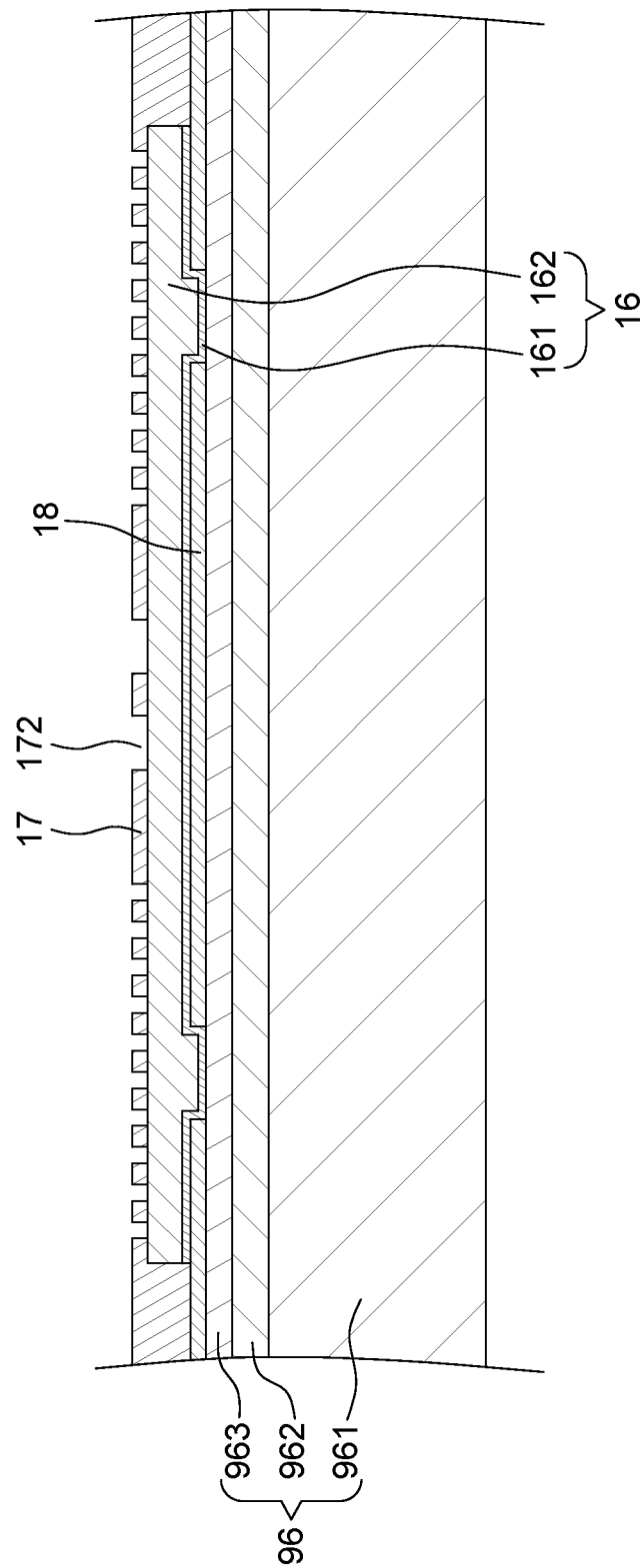
FIG. 16 illustrates one or more stages of an example of a method for manufacturing a semiconductor package structure according to some embodiments of the present disclosure.

Referring to FIG. 16, portions of the dielectric structure 17 are removed by, for example, photolithography, to form a plurality of openings 172 to expose a portion of the circuit layer 16 (e.g., portions of the metal layer 162).

Figure 17:
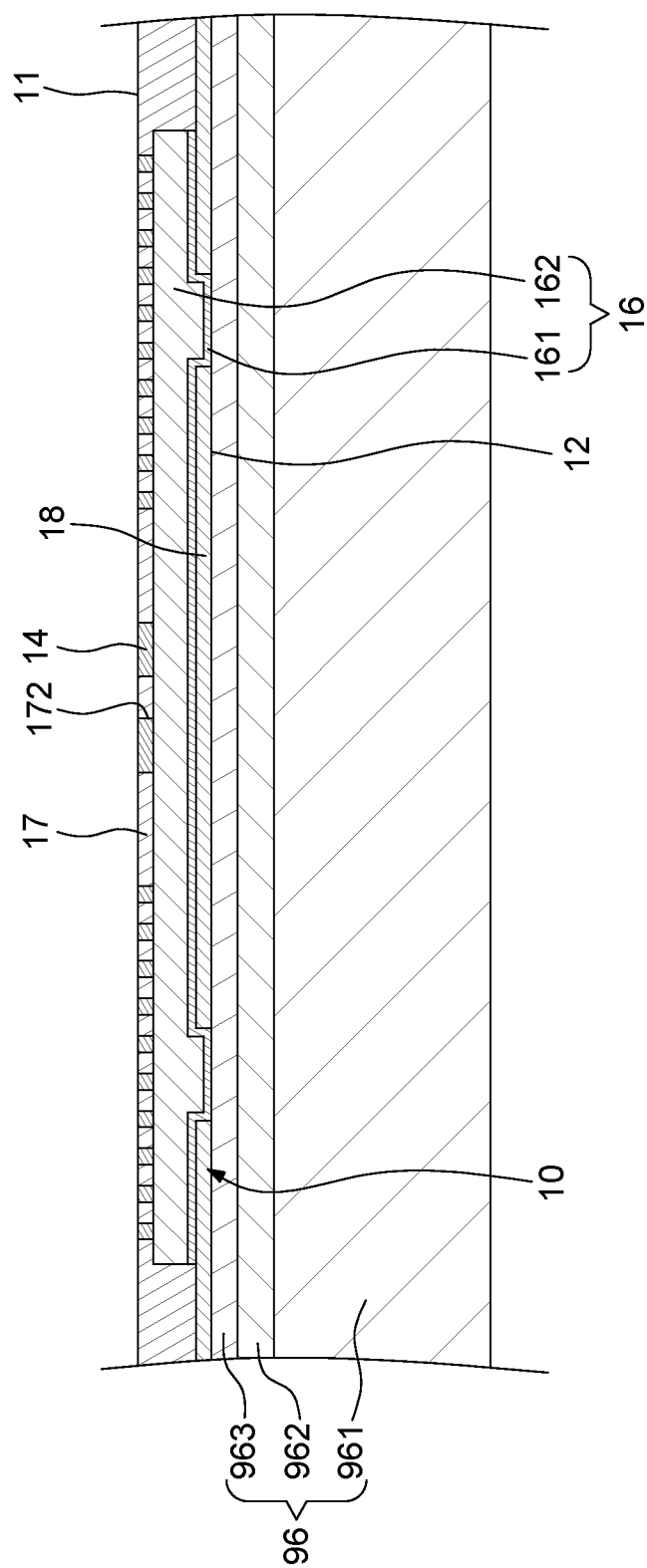
FIG. 17 illustrates one or more stages of an example of a method for manufacturing a semiconductor package structure according to some embodiments of the present disclosure.

Referring to FIG. 17, a plurality of wire bonding pads 14 are formed in the openings 172 of the dielectric structure 17 and on the exposed portions of the metal layer 162 of the circuit layer 16, so as to form the conductive structure 10. The conductive structure 10 has a top surface 11 and a bottom surface 12 opposite to the top surface 11, and includes the insulating layer 18, the dielectric structure 17, the circuit layer 16 and the wire bonding pads 14. It is noted that the insulating layer 18 may be a portion of the dielectric structure 17.

Figure 18:
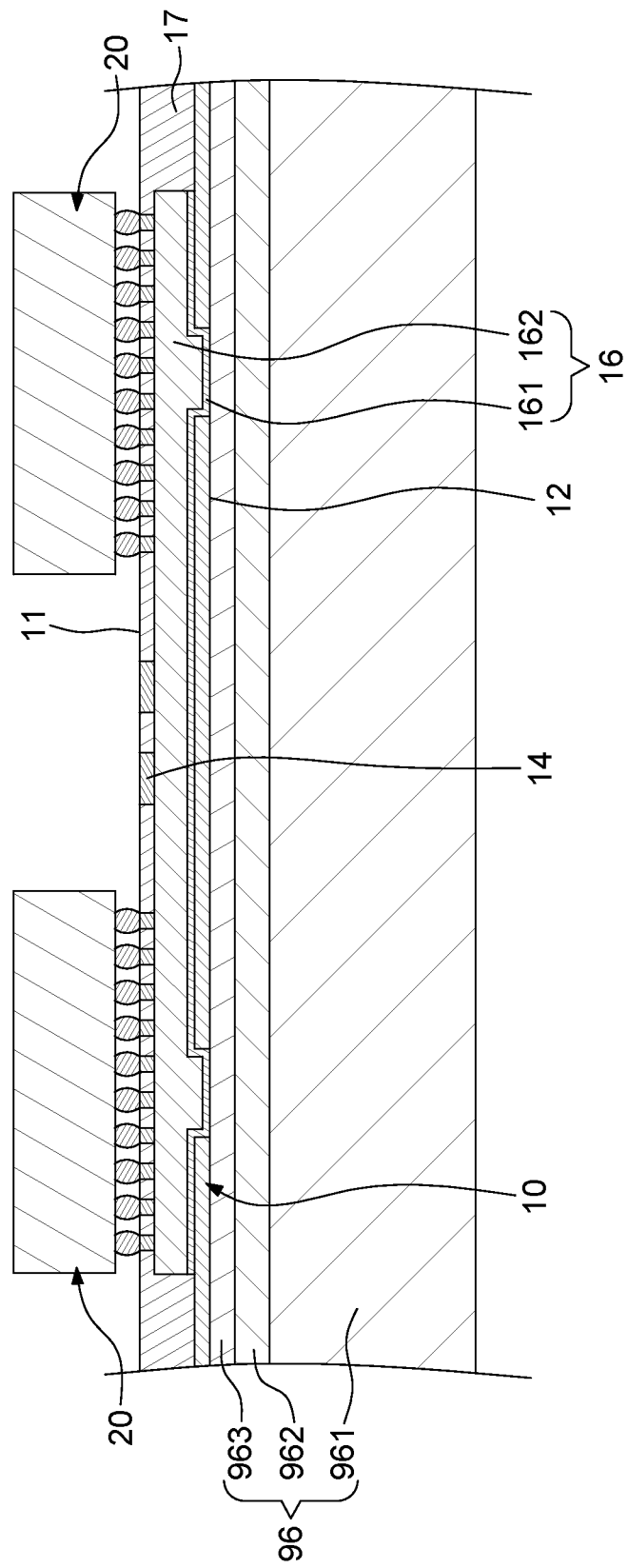
FIG. 18 illustrates one or more stages of an example of a method for manufacturing a semiconductor package structure according to some embodiments of the present disclosure.

Referring to FIG. 18, at least one first semiconductor element 20 is disposed on and electrically connected to the conductive structure 10. The first semiconductor element 20 may be, for example, a semiconductor die or a semiconductor chip. The first semiconductor element 20 is bonded to the conductive structure 10 by flip chip bonding. In some embodiments, the first semiconductor element 20 may be bonded to the conductive structure 10 by wire bonding as shown in FIG. 6.

Figure 19:
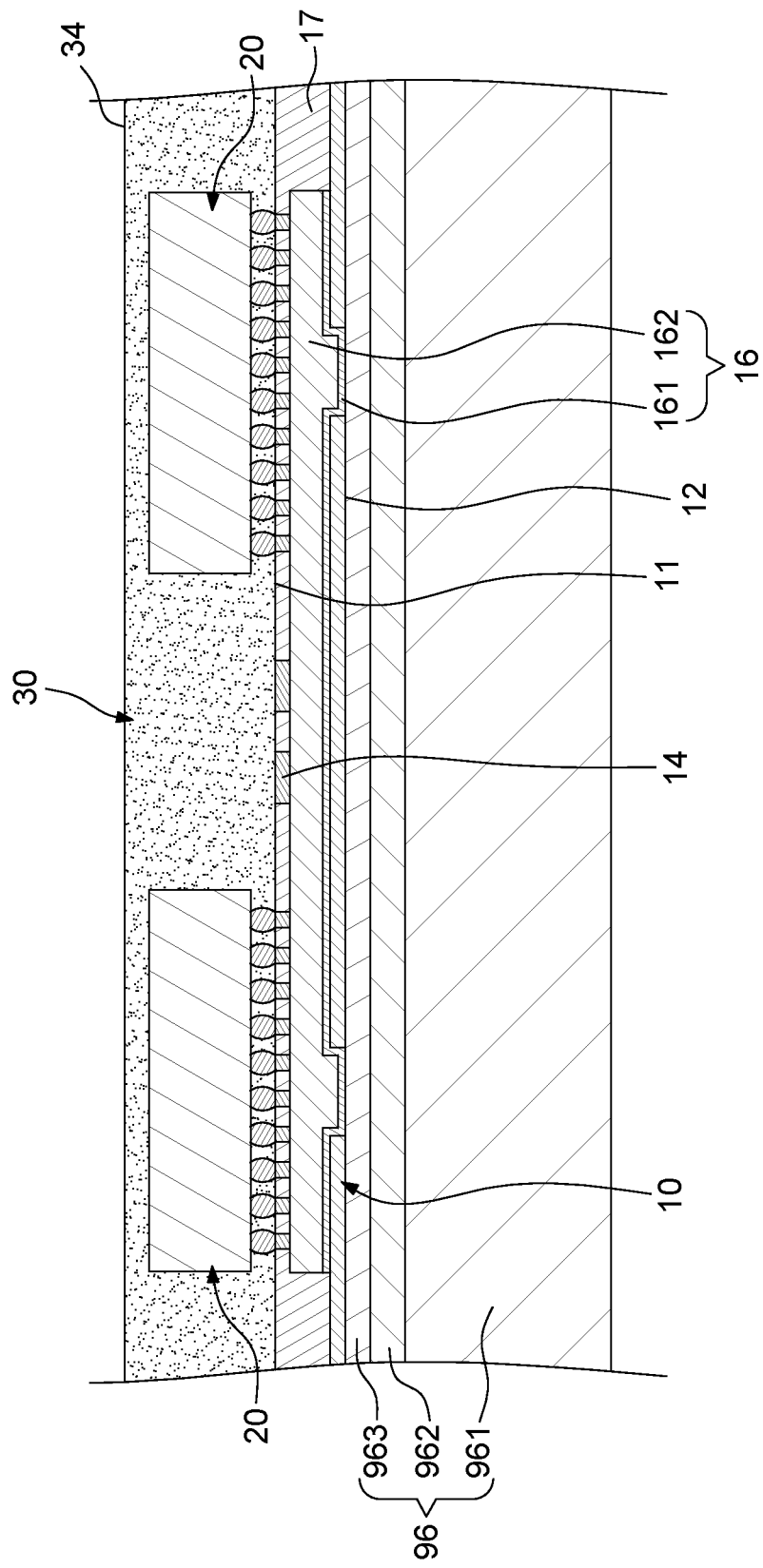
FIG. 19 illustrates one or more stages of an example of a method for manufacturing a semiconductor package structure according to some embodiments of the present disclosure.

Referring to FIG. 19, a first encapsulant 30 is formed or disposed on the conductive structure 10 to cover the first semiconductor element 20, the wire bonding pads 14 of the conductive structure 10 and a top surface 11 of the conductive structure 10. A material of the first encapsulant 30 may be a molding compound with or without fillers. The first encapsulant 30 has a top surface 34.

Figure 20:
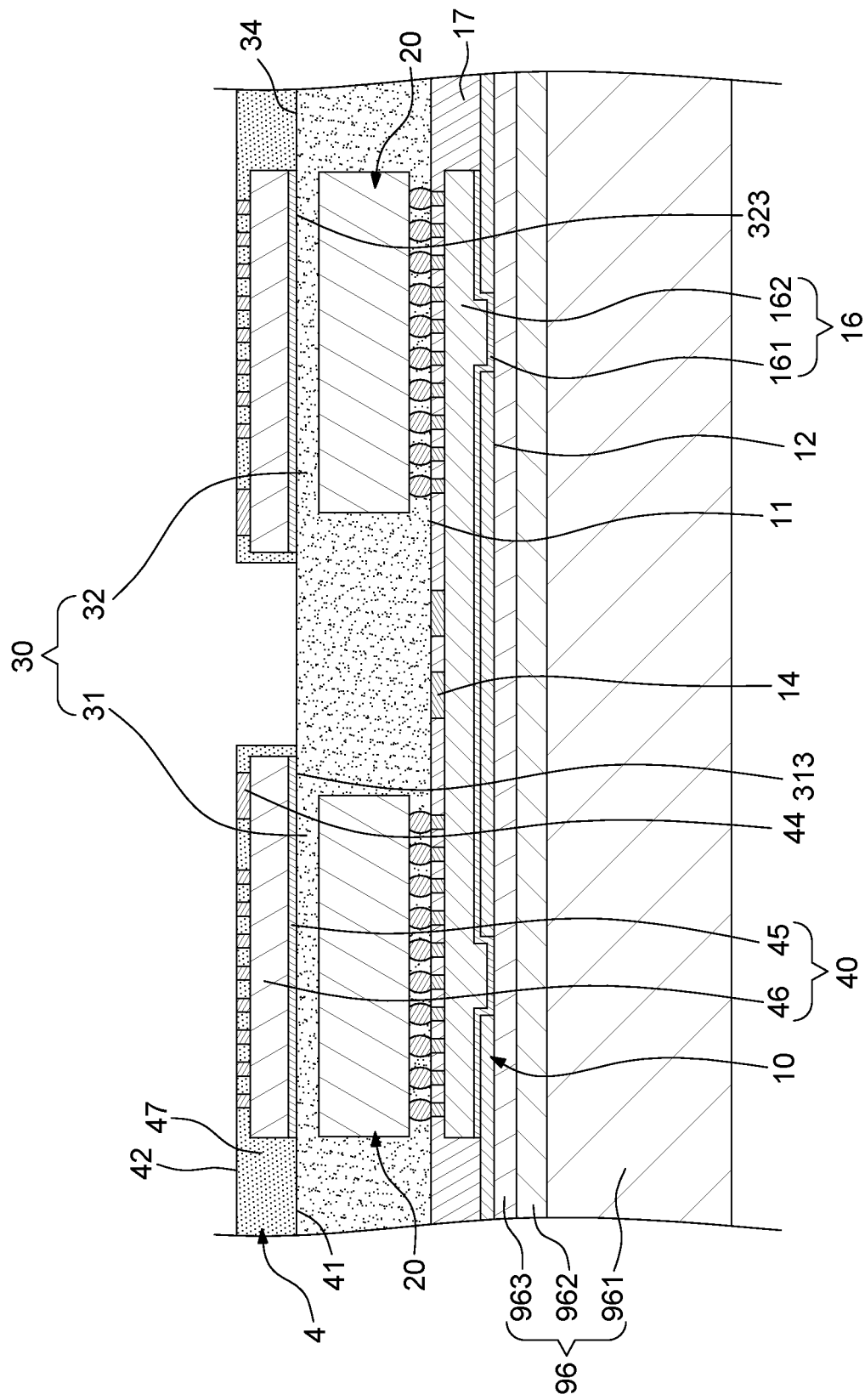
FIG. 20 illustrates one or more stages of an example of a method for manufacturing a semiconductor package structure according to some embodiments of the present disclosure.

Referring to FIG. 20, a plurality of redistribution structures 4 are formed or disposed on the first encapsulant 30. The forming steps of the redistribution structure 4 may be the same as, or similar to, the forming steps of the conductive structure 10 illustrated in FIG. 13 through FIG. 17.

The redistribution structure 4 has a first surface 41 facing the first encapsulant 30 and a second surface 42 opposite to the first surface 41, and includes a dielectric structure 47, a redistribution layer 40 and a plurality of wire bonding pads 44 exposed from the second surface 42. The redistribution layer 40 is embedded in the dielectric structure 47 and includes a seed layer 45 disposed on the top surface 34 of the first encapsulant 30 and a metal layer 46 disposed on the seed layer 45. The wire bonding pads 44 are disposed on and electrically connected to the redistribution layer 40.

Figure 21:
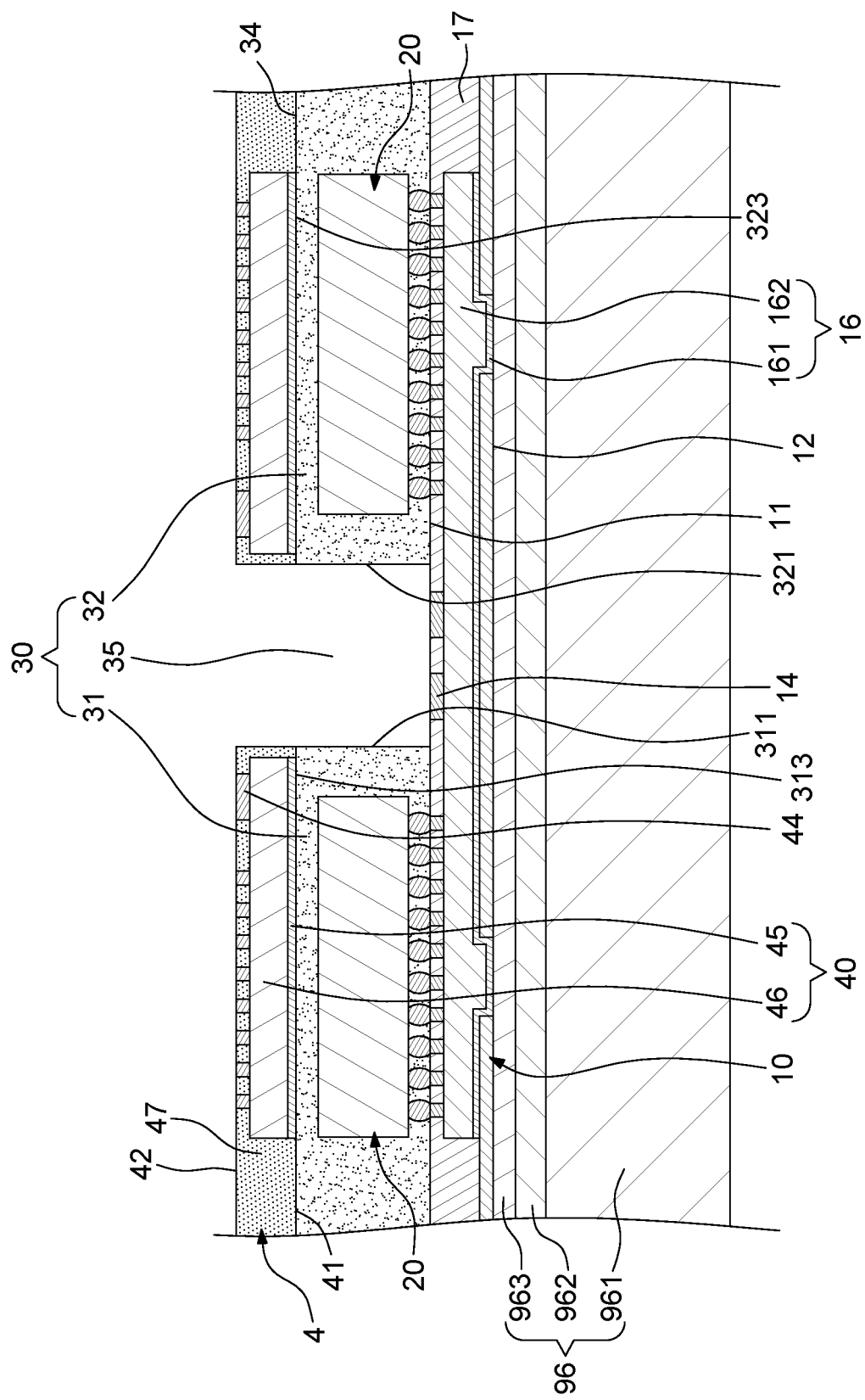
FIG. 21 illustrates one or more stages of an example of a method for manufacturing a semiconductor package structure according to some embodiments of the present disclosure.

Referring to FIG. 21, the first encapsulant 30 is etched through, for example, dry etching (e.g., plasma dry etching), to form a first encapsulant portion 31, a second encapsulant portion 32 spaced apart from the first encapsulant portion 31 and at least one opening 35 between the first encapsulant portion 31 and the second encapsulant portion 32. The first encapsulant portion 31 and the second encapsulant portion 32 cover the first semiconductor elements 20. The opening 35 exposes the wire bonding pads 14 and a portion of the top surface 11 of the conductive structure 10.

The first encapsulant portion 31 includes an inner lateral surface 311 and an upper surface 313. The second encapsulant portion 32 includes an inner lateral surface 321 opposite to the inner lateral surface 311 of the first encapsulant portion 31 and an upper surface 323. In some embodiments, the top surface 34 of the first encapsulant 30 may include the upper surface 313 of the first encapsulant portion 31 and the upper surface 323 of the second encapsulant portion 32. A height of the first encapsulant portion 31 may be substantially equal to a height of the second encapsulant portion 32.

Figure 22:
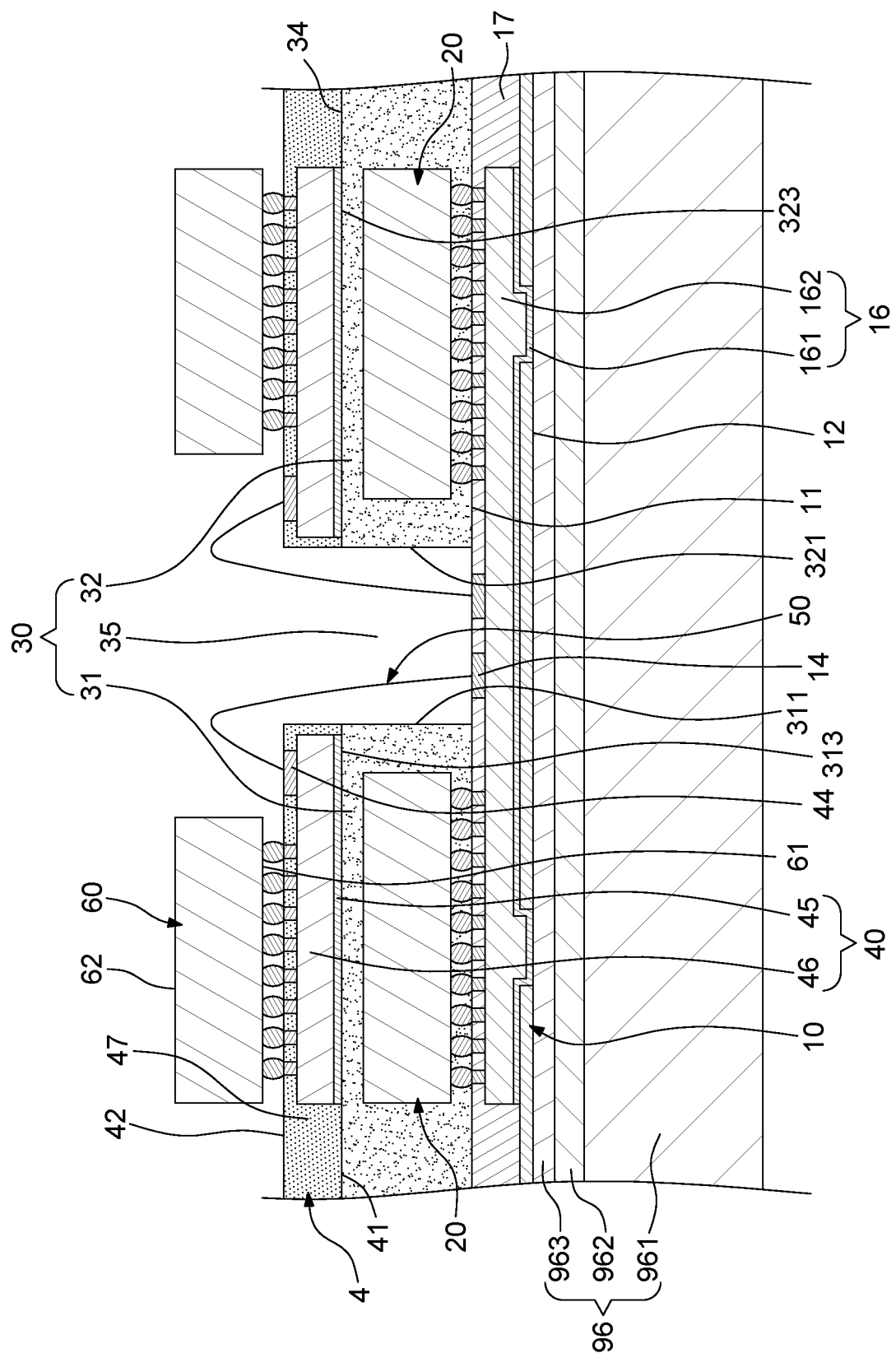
FIG. 22 illustrates one or more stages of an example of a method for manufacturing a semiconductor package structure according to some embodiments of the present disclosure.

Referring to FIG. 22, at least one second semiconductor element 60 is disposed on and electrically connected to the redistribution structure 4, and a plurality of bonding wires 50 electrically connect the redistribution structure 4 and the conductive structure 10. The second semiconductor element 60 may be, for example, a semiconductor die or a semiconductor chip. The second semiconductor element 60 is bonded to the redistribution structure 4 by flip chip bonding. In some embodiments, the second semiconductor element 60 may be bonded to the redistribution structure 4 by wire bonding as shown in FIG. 6. A portion of each of the bonding wires 50 may be disposed in the opening 35.

Figure 23:
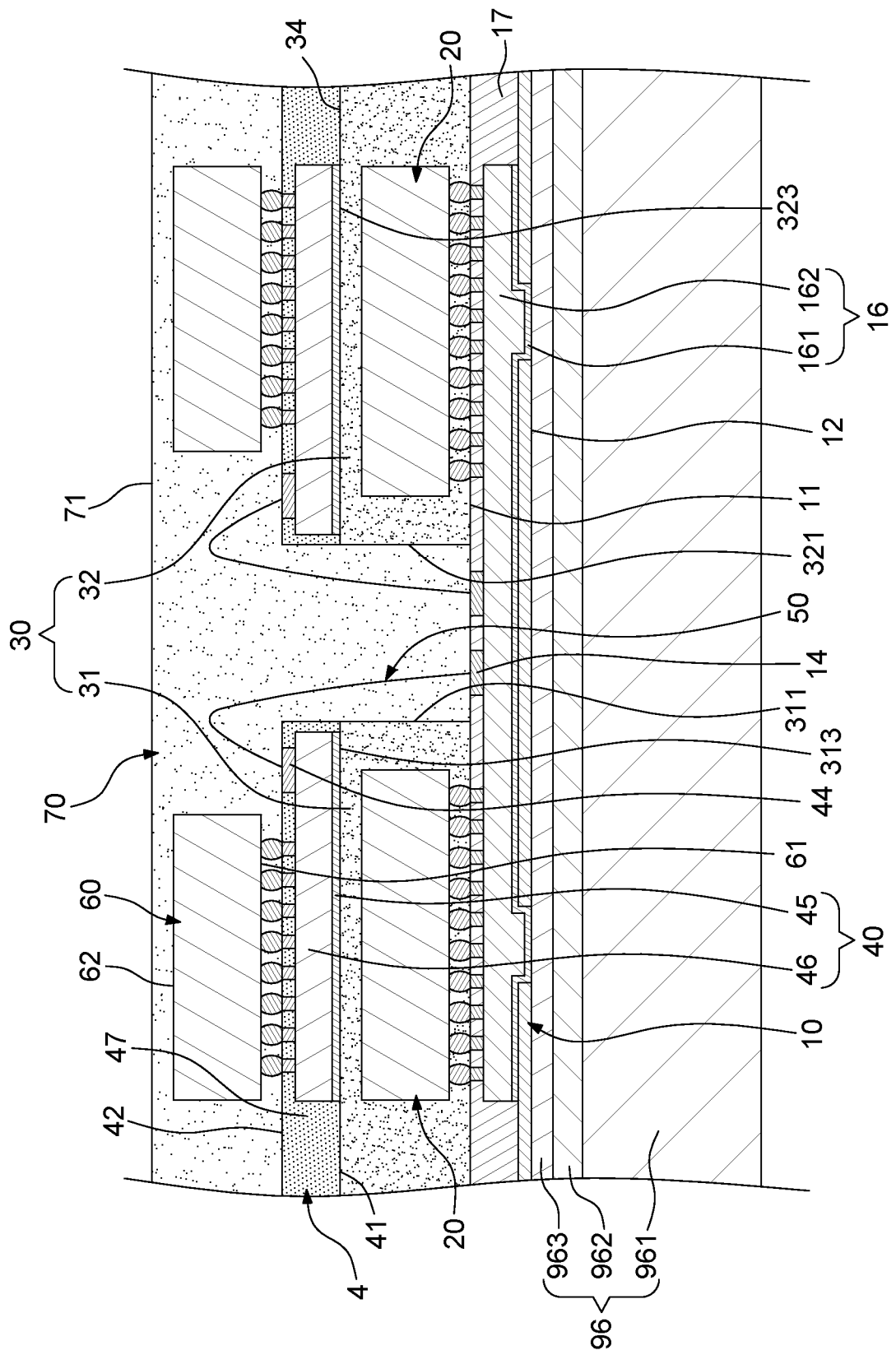
FIG. 23 illustrates one or more stages of an example of a method for manufacturing a semiconductor package structure according to some embodiments of the present disclosure.

Referring to FIG. 22 and FIG. 23, a second encapsulant 70 is formed or disposed on the redistribution structure 4 to cover at least a portion of the second semiconductor element 60 and in the opening 35 to cover the bonding wires 50 and in direct contact with the first encapsulant portion 31 and the second encapsulant portion 32 of the first encapsulant 30. A material of the second encapsulant 70 may be a molding compound with or without fillers. The second encapsulant 70 also covers the wire bonding pads 44 of the redistribution structure 4 and the wire bonding pads 14 of the conductive structure 10. In some embodiments, the second encapsulant 70 is in direct contact with the inner lateral surface 311 of the first encapsulant portion 31 and the inner lateral surface 321 of the second encapsulant portion 32. In some embodiments, a top surface 62 of the second semiconductor element 60 may be covered by the second encapsulant 70. In some embodiments, the top surface 62 of the second semiconductor element 60 may be exposed from a top surface 71 of the second encapsulant 70 as shown in FIG. 3.

Figure 24:
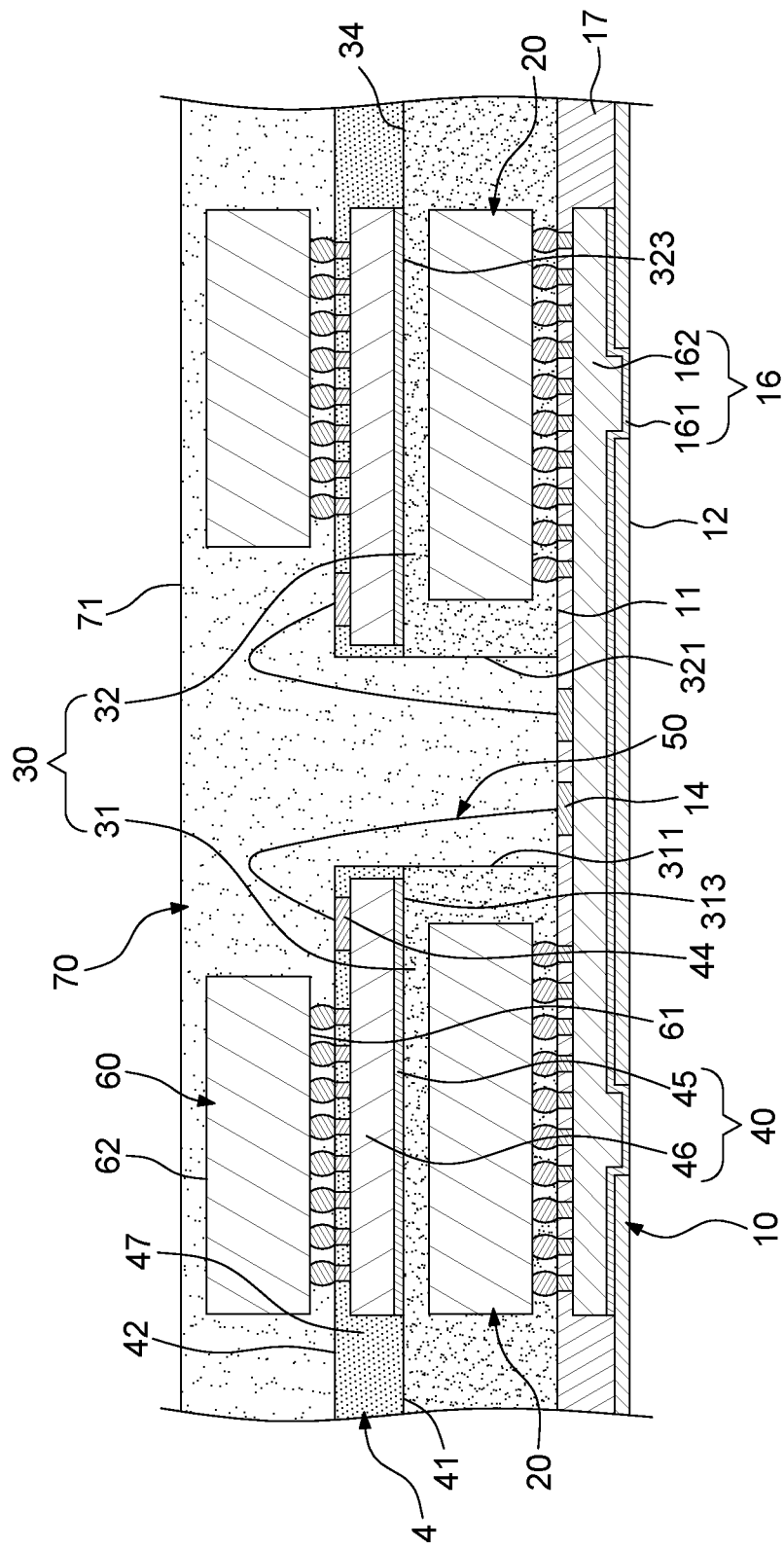
FIG. 24 illustrates one or more stages of an example of a method for manufacturing a semiconductor package structure according to some embodiments of the present disclosure.

Referring to FIG. 24, the carrier structure 96 is removed after the second encapsulant 70 is formed. Then, a singulation process is conducted to obtain a plurality of semiconductor package structures 1 of FIG. 1.

Figure 25:
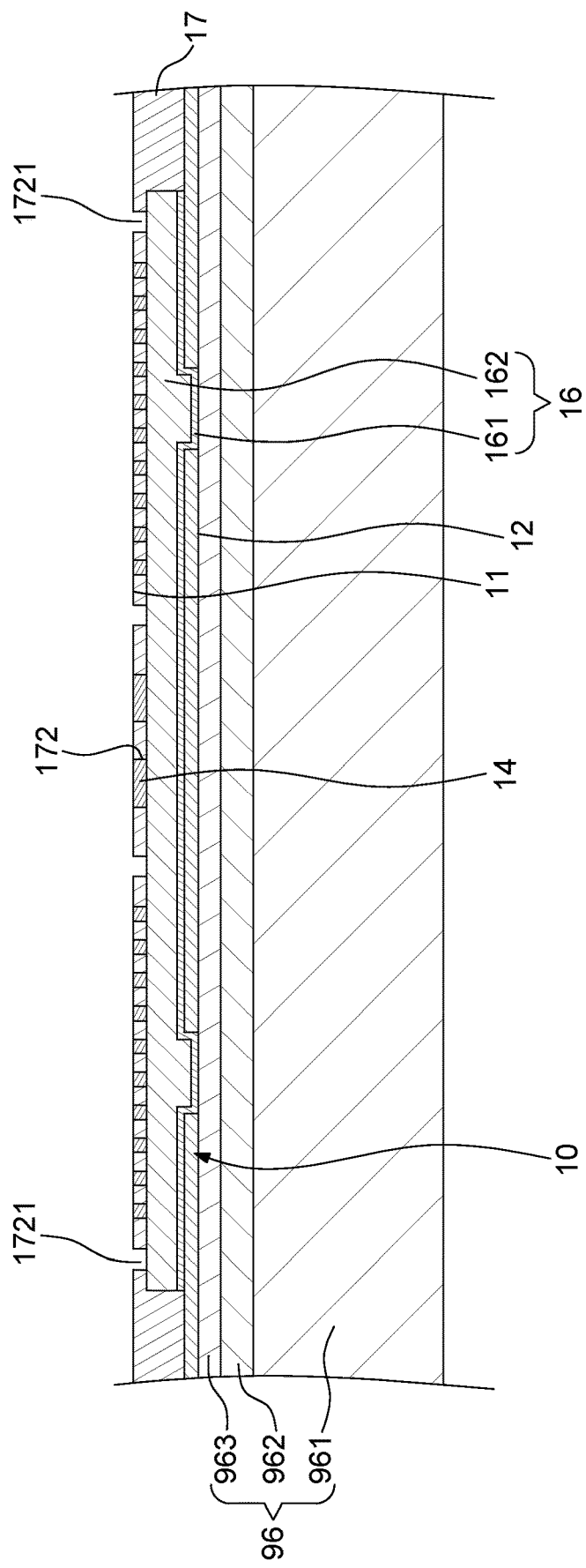
FIG. 25 illustrates one or more stages of an example of a method for manufacturing a semiconductor package structure according to some embodiments of the present disclosure.

FIG. 25 through FIG. 34 illustrate a method for manufacturing a semiconductor package structure according to some embodiments of the present disclosure. In some embodiments, the method is for manufacturing a semiconductor package structure such as the semiconductor package structure 1a shown in FIG. 2. The initial several stages of the illustrated process are the same as, or similar to, the stages illustrated in FIG. 10 through FIG. 16. FIG. 25 depicts a stage subsequent to that depicted in FIG. 16.

Referring to FIG. 25, a plurality of wire bonding pads 14 are formed in some of the openings 172 of the dielectric structure 17 and on some of the exposed portions of the metal layer 162 of the circuit layer 16, so as to form the conductive structure 10. That is, some of the openings 172 (e.g., openings 1721) may be still empty.

Figure 26:
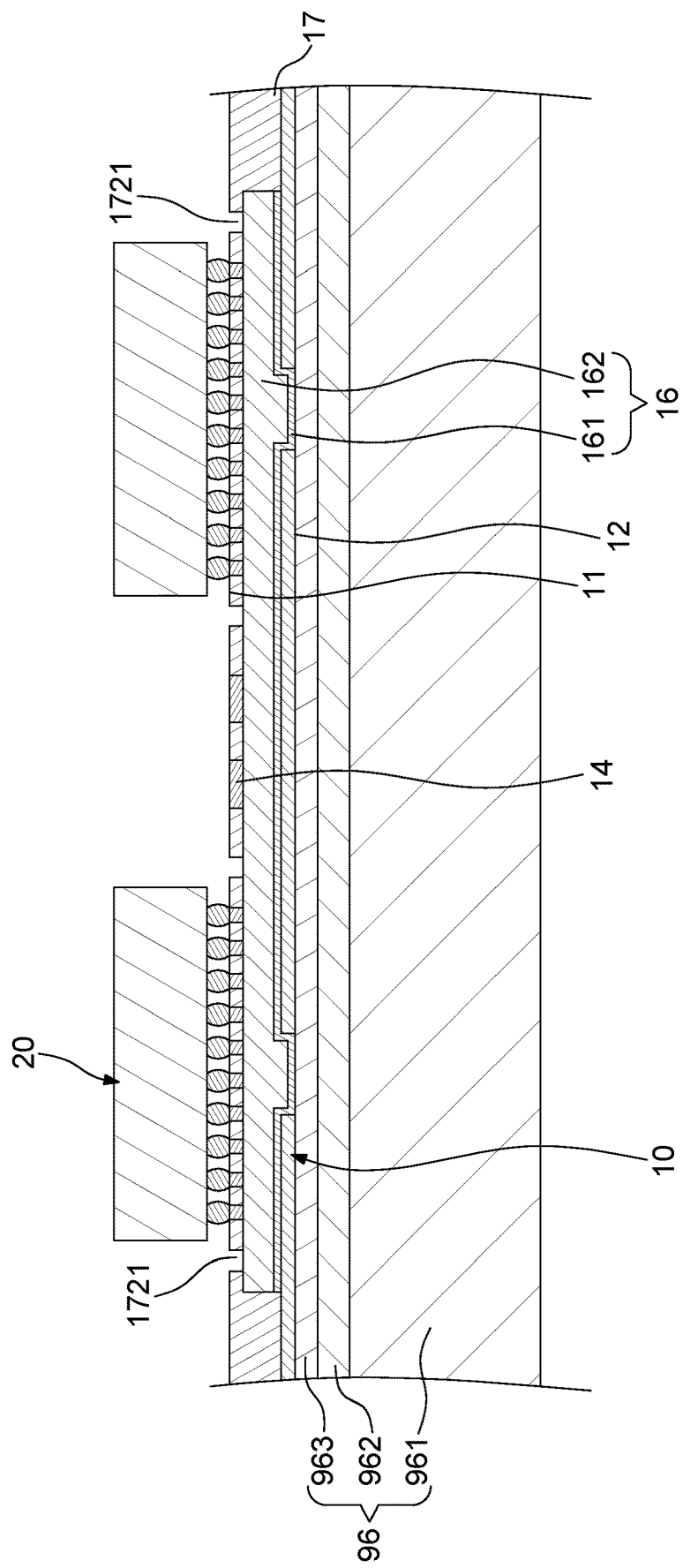
FIG. 26 illustrates one or more stages of an example of a method for manufacturing a semiconductor package structure according to some embodiments of the present disclosure.

Referring to FIG. 26, at least one first semiconductor element 20 is disposed on and electrically connected to the conductive structure 10. The first semiconductor element 20 may be, for example, a semiconductor die or a semiconductor chip. The first semiconductor element 20 is bonded to the conductive structure 10 by flip chip bonding.

Figure 27:
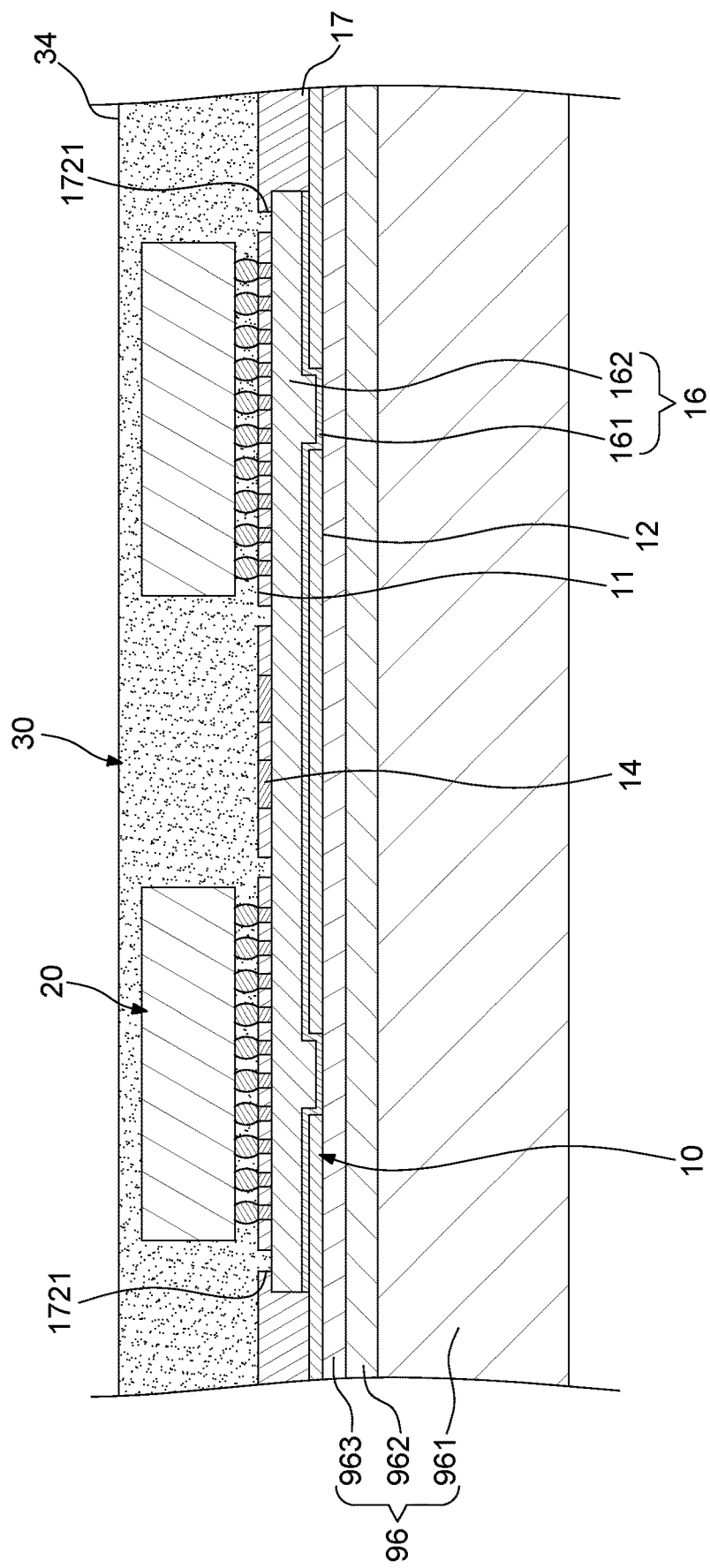
FIG. 27 illustrates one or more stages of an example of a method for manufacturing a semiconductor package structure according to some embodiments of the present disclosure.

Referring to FIG. 27, a first encapsulant 30 is formed or disposed on the conductive structure 10 to cover the first semiconductor elements 20, the wire bonding pads 14 of the conductive structure 10, a top surface 11 of the conductive structure 10 and the openings 1721 of the conductive structure 10. A material of the first encapsulant 30 may be a molding compound with or without fillers.

Figure 28:
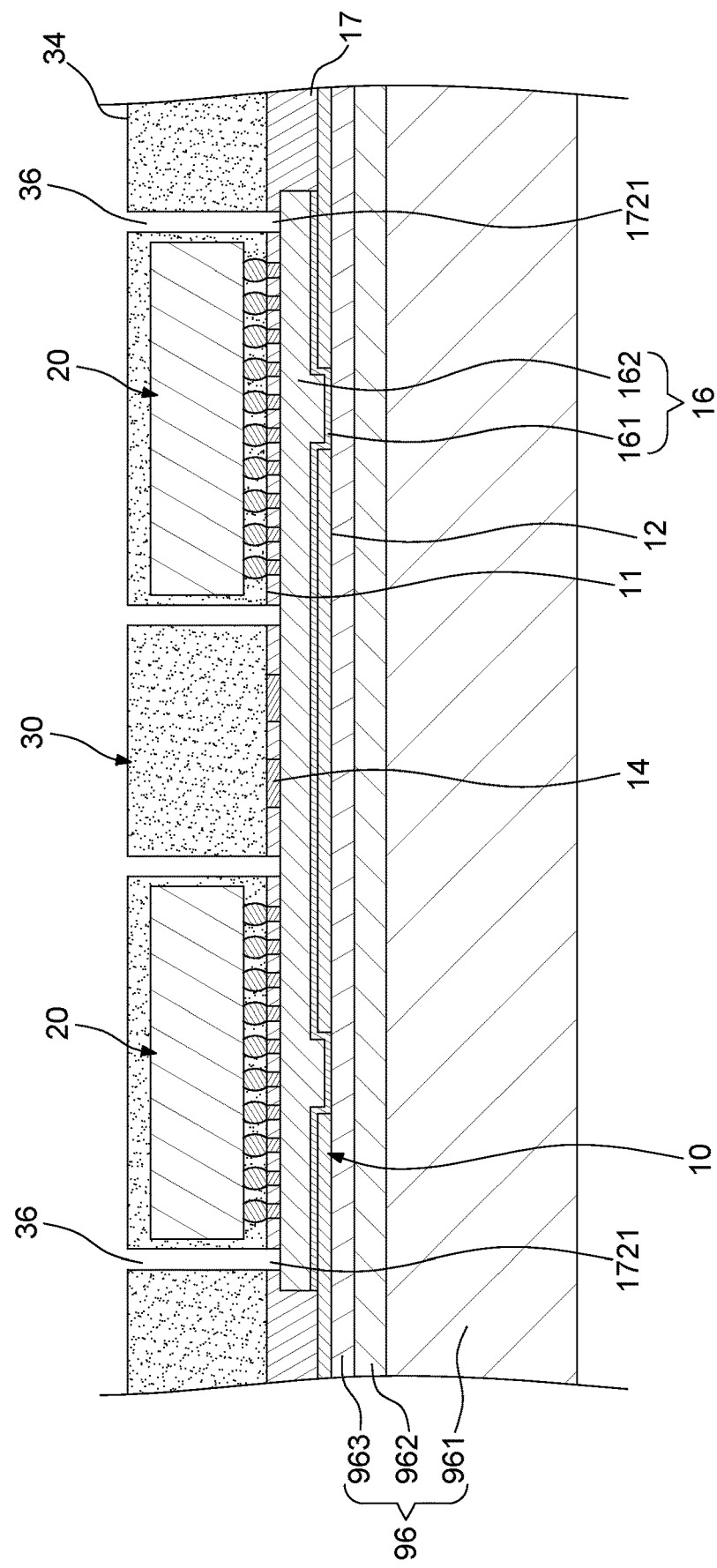
FIG. 28 illustrates one or more stages of an example of a method for manufacturing a semiconductor package structure according to some embodiments of the present disclosure.

Referring to FIG. 28, a portion of the first encapsulant 30 that corresponds to the openings 1721 of the conductive structure 10 is etched through, for example, dry etching (e.g., plasma dry etching), to form a plurality of through holes 36 and expose the openings 1721 and the portion of the circuit layer 16 (e.g., some of the exposed portions of the metal layer 162).

Figure 29:
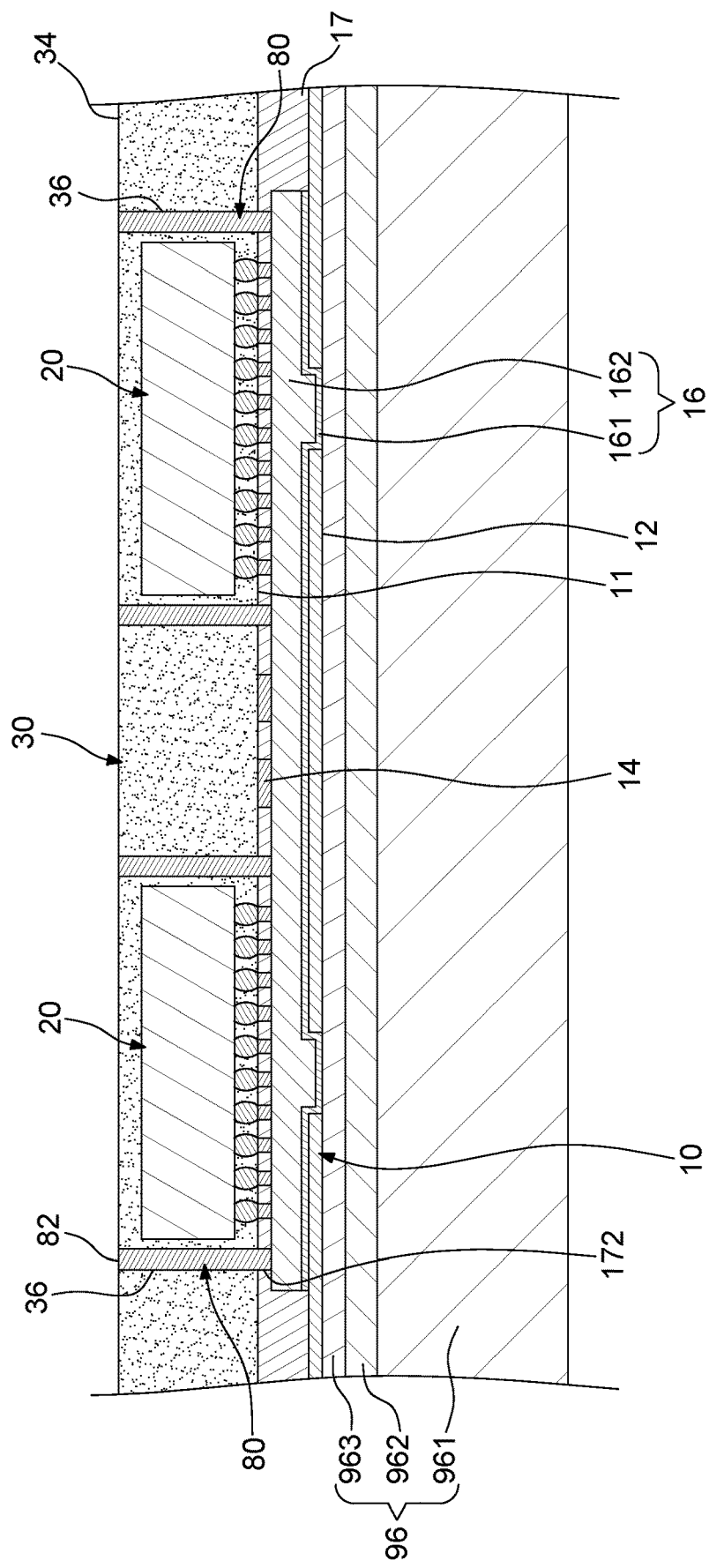
FIG. 29 illustrates one or more stages of an example of a method for manufacturing a semiconductor package structure according to some embodiments of the present disclosure.

Referring to FIG. 29, a pillar 80 is formed in each of the through holes 36 and each of the openings 1721.

Figure 30:
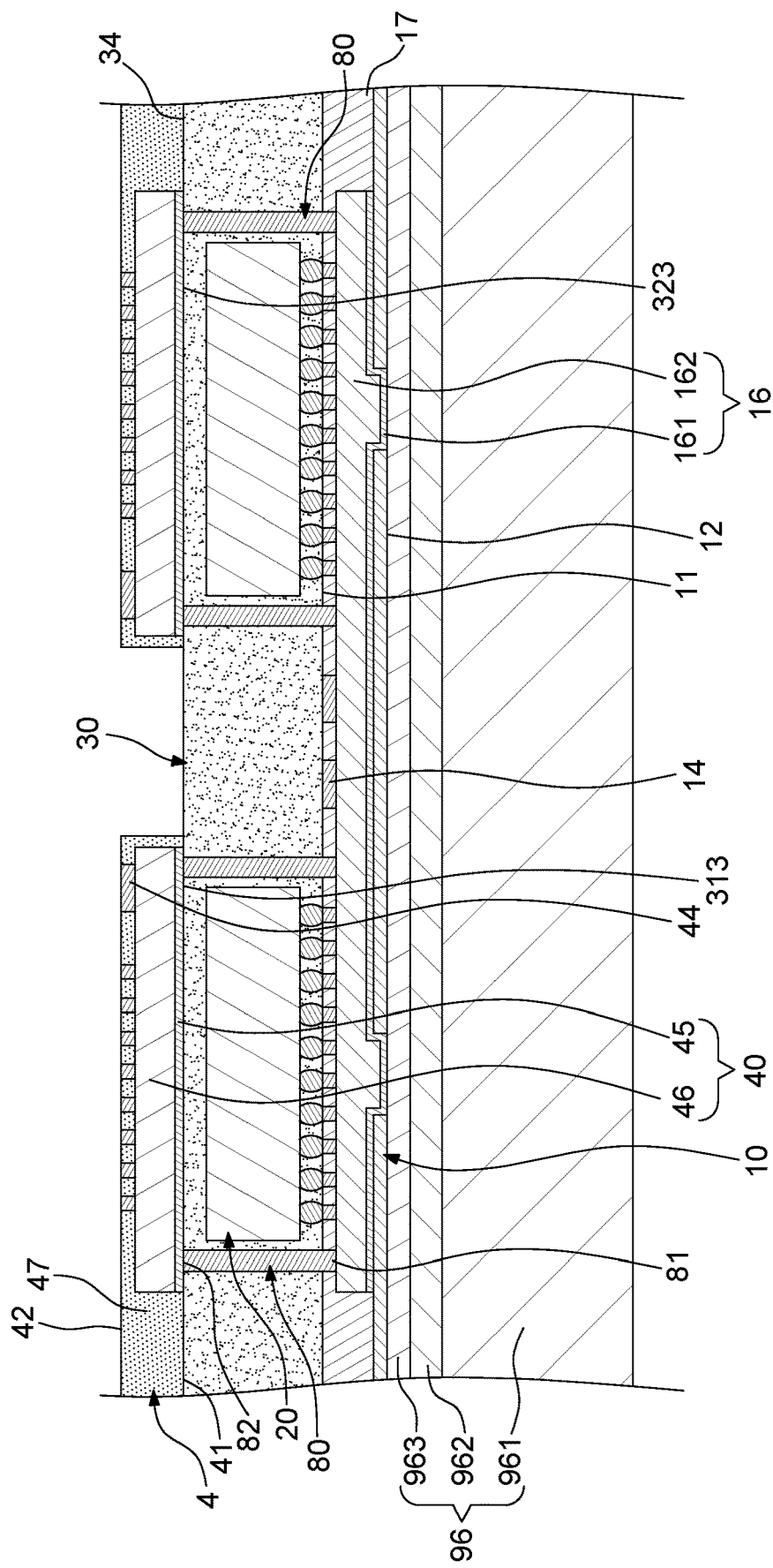
FIG. 30 illustrates one or more stages of an example of a method for manufacturing a semiconductor package structure according to some embodiments of the present disclosure.

Referring to FIG. 30, a plurality of redistribution structures 4 are formed or disposed on the first encapsulant 30 and the pillars 80. The forming steps of the redistribution structure 4 may be the same as, or similar to, the forming steps of the conductive structure 10 illustrated in FIG. 13 through FIG. 17.

The redistribution structure 4 has a first surface 41 facing the first encapsulant 30 and a second surface 42 opposite to the first surface 41, and includes a dielectric structure 47, a redistribution layer 40 and a plurality of wire bonding pads 44 exposed from the second surface 42. The redistribution layer 40 is embedded in the dielectric structure 47 and includes a seed layer 45 disposed on a top surface 34 of the first encapsulant 30 and the pillars 80 and a metal layer 46 disposed on the seed layer 45. The wire bonding pads 44 are disposed on and electrically connected to the redistribution layer 40.

Figure 31:
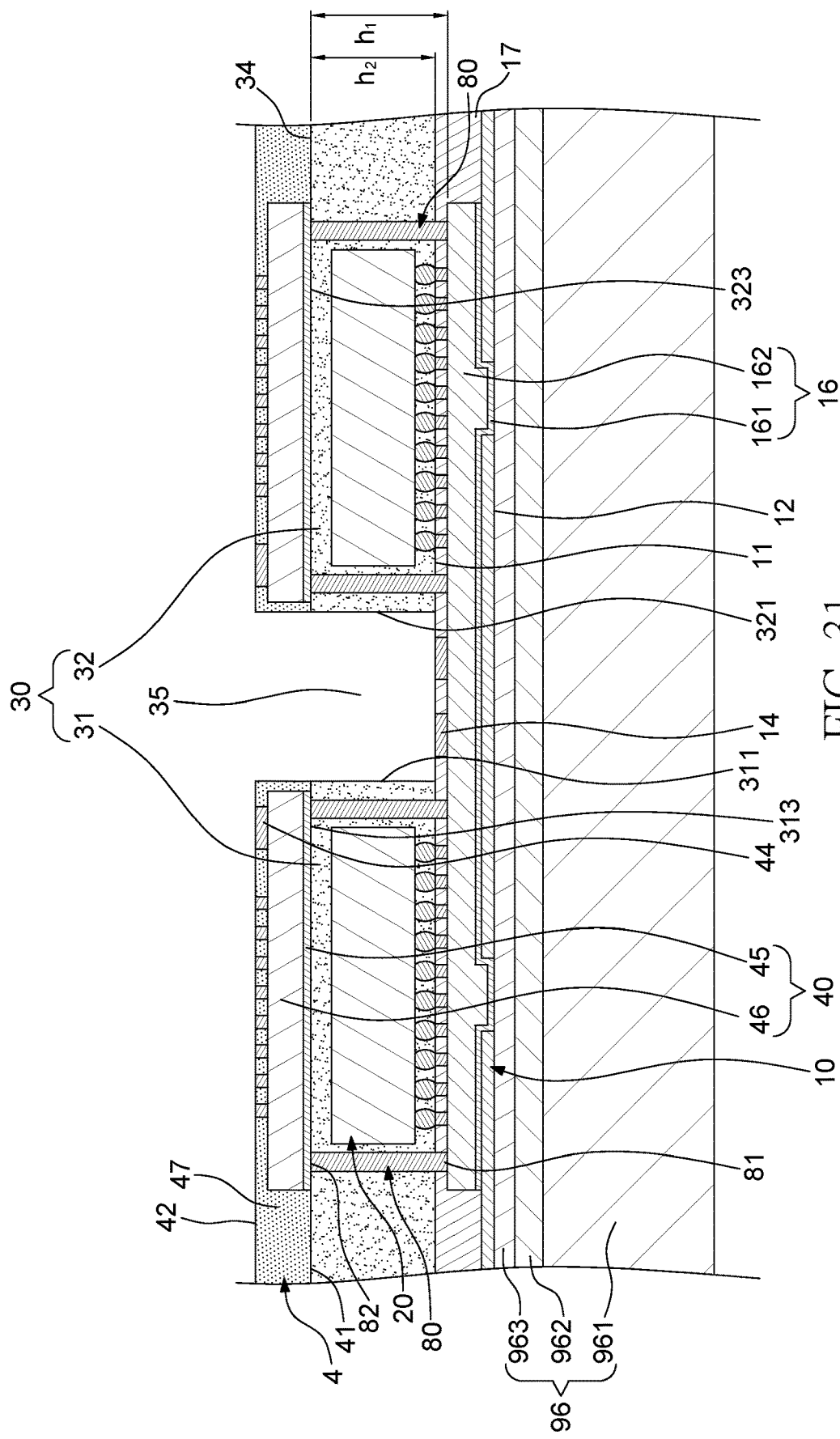
FIG. 31 illustrates one or more stages of an example of a method for manufacturing a semiconductor package structure according to some embodiments of the present disclosure.

Referring to FIG. 31, the first encapsulant 30 is etched through, for example, dry etching (e.g., plasma dry etching), to form a first encapsulant portion 31, a second encapsulant portion 32 spaced apart from the first encapsulant portion 31 and at least one opening 35 between the first encapsulant portion 31 and the second encapsulant portion 32. The first encapsulant portion 31 and the second encapsulant portion 32 cover the first semiconductor elements 20. The opening 35 exposes the wire bonding pads 14 and a portion of the top surface 11 of the conductive structure 10.

The first encapsulant portion 31 includes an inner lateral surface 311 and an upper surface 313. The second encapsulant portion 32 includes an inner lateral surface 321 opposite to the inner lateral surface 311 of the first encapsulant portion 31 and an upper surface 323. In some embodiments, the top surface 34 of the first encapsulant 30 may include the upper surface 313 of the first encapsulant portion 31 and the upper surface 323 of the second encapsulant portion 32. A height of the first encapsulant portion 31 may be substantially equal to a height of the second encapsulant portion 32.

Figure 32:
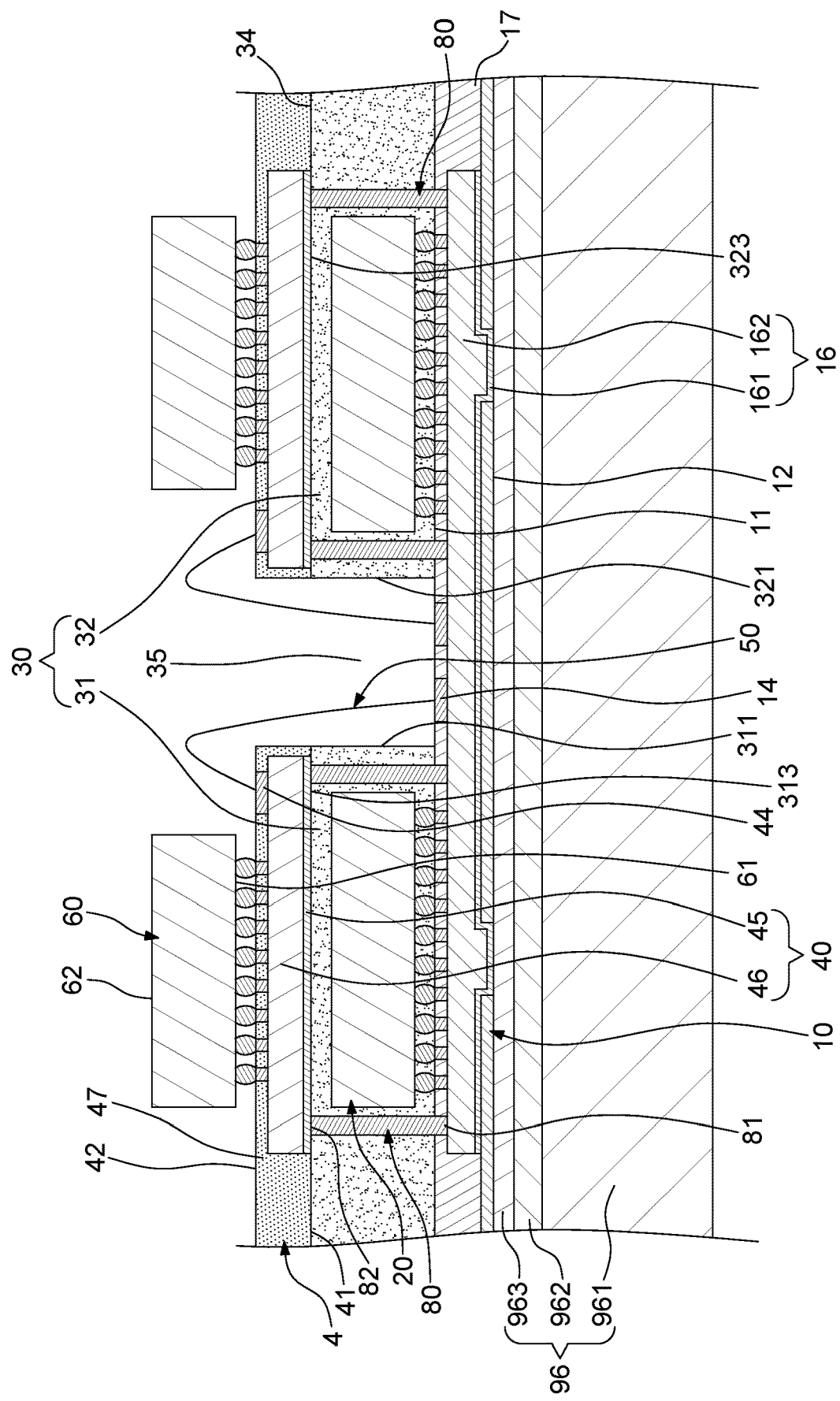
FIG. 32 illustrates one or more stages of an example of a method for manufacturing a semiconductor package structure according to some embodiments of the present disclosure.

Referring to FIG. 32, at least one second semiconductor element 60 is disposed on and electrically connected to the redistribution structure 4, and a plurality of bonding wires 50 electrically connect the redistribution structure 4 and the conductive structure 10. The second semiconductor element 60 may be, for example, a semiconductor die or a semiconductor chip. The second semiconductor element 60 is bonded to the redistribution structure 4 by flip chip bonding. In some embodiments, the second semiconductor element 60 may be bonded to the redistribution structure 4 by wire bonding as shown in FIG. 6. A portion of each of the bonding wires 50 may be disposed in the opening 35.

Figure 33:
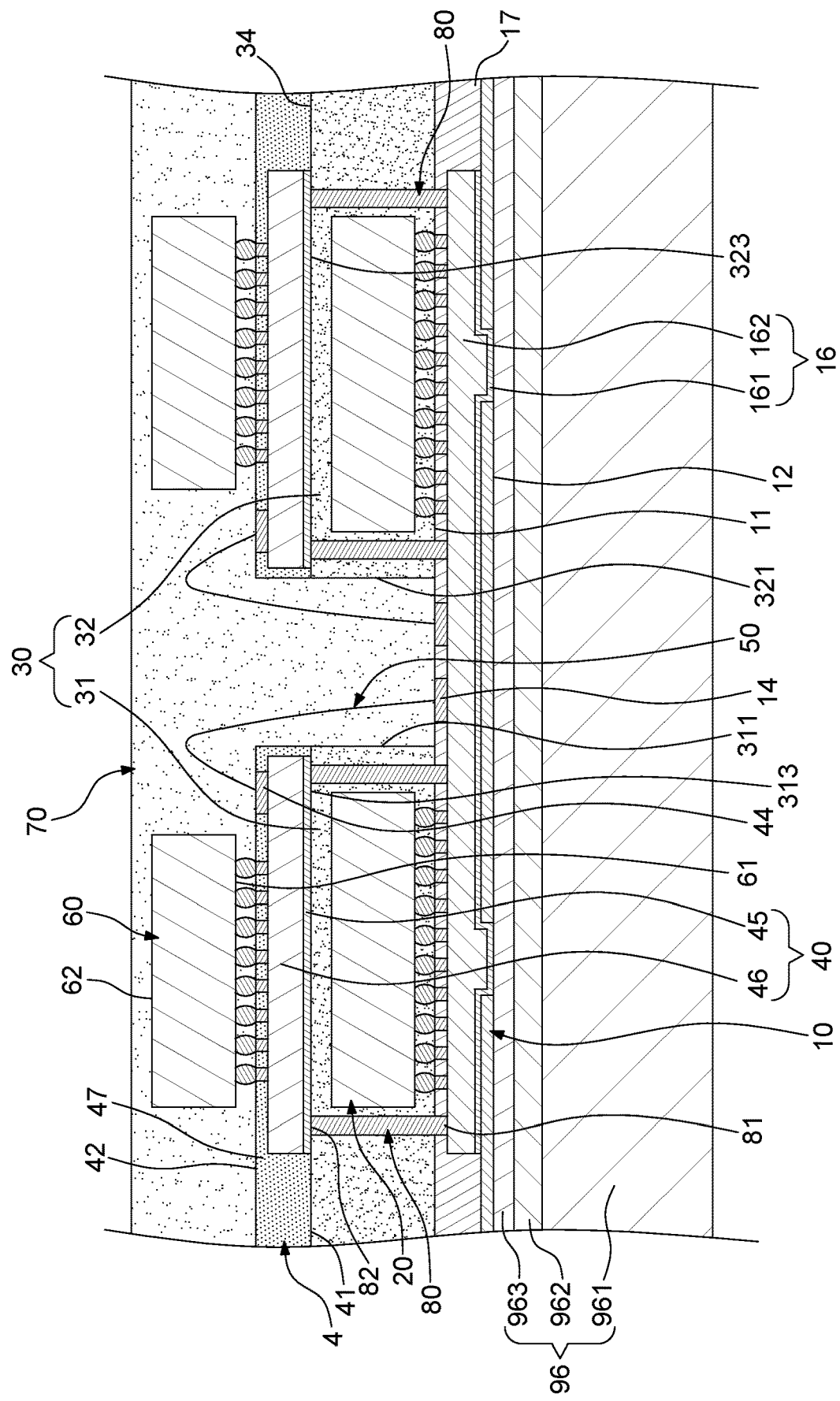
FIG. 33 illustrates one or more stages of an example of a method for manufacturing a semiconductor package structure according to some embodiments of the present disclosure.

Referring to FIG. 33, a second encapsulant 70 is formed or disposed on the redistribution structure 4 to cover at least a portion of the second semiconductor element 60 and in the opening 35 to cover the bonding wires 50 and in direct contact with the first encapsulant portion 31 and the second encapsulant portion 32 of the first encapsulant 30. A material of the second encapsulant 70 may be a molding compound with or without fillers. The second encapsulant 70 also covers the wire bonding pads 44 of the redistribution structure 4 and the wire bonding pads 14 of the conductive structure 10. In some embodiments, the second encapsulant 70 is in direct contact with the inner lateral surface 311 of the first encapsulant portion 31 and the inner lateral surface 321 of the second encapsulant portion 32. In some embodiments, a top surface 62 of the second semiconductor element 60 may be covered by the second encapsulant 70. In some embodiments, the top surface 62 of the second semiconductor element 60 may be exposed from a top surface 71 of the second encapsulant 70 as shown in FIG. 3.

Figure 34:
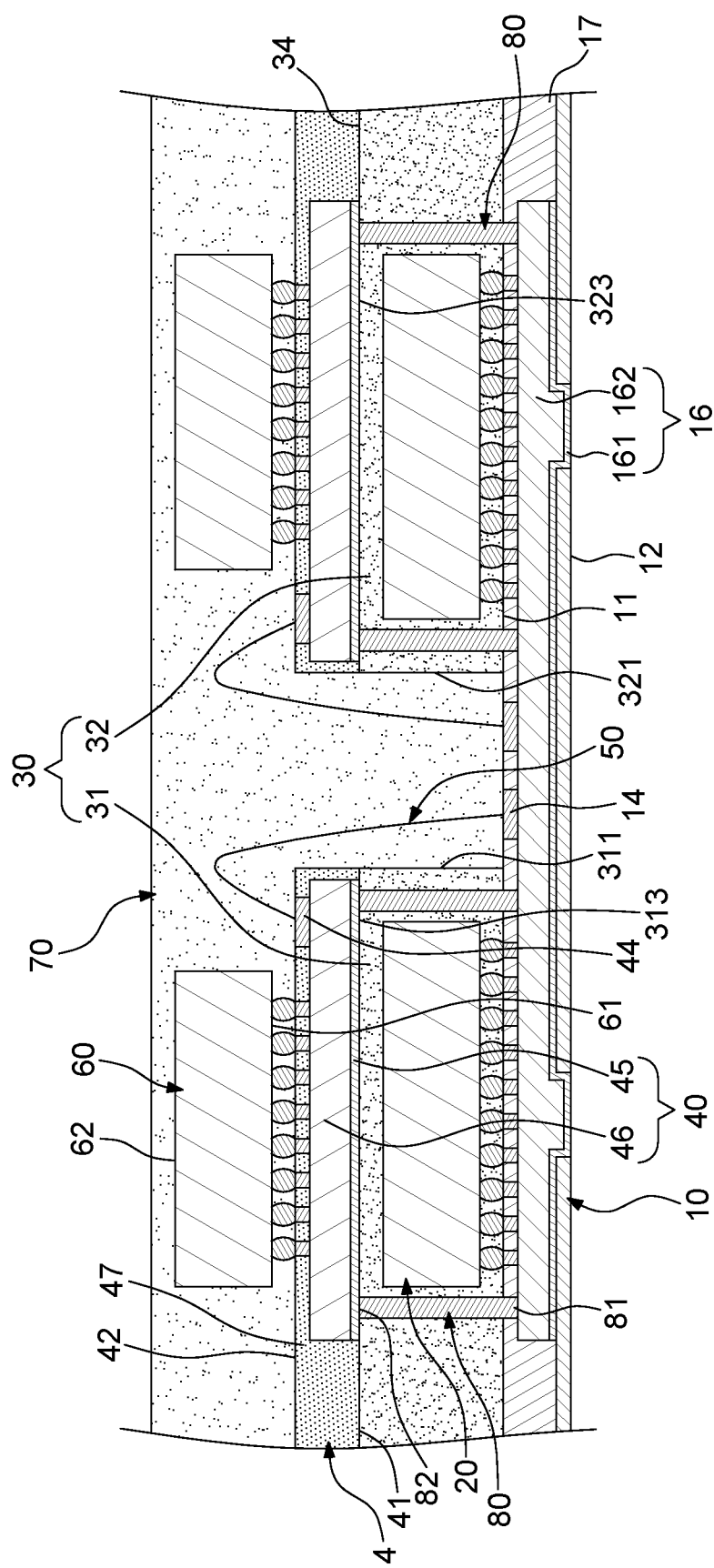
FIG. 34 illustrates one or more stages of an example of a method for manufacturing a semiconductor package structure according to some embodiments of the present disclosure.

Referring to FIG. 34, the carrier structure 96 is removed after the second encapsulant 70 is formed. Then, a singulation process is conducted to obtain a plurality of semiconductor package structures 1a of FIG. 2.

Figure 35:
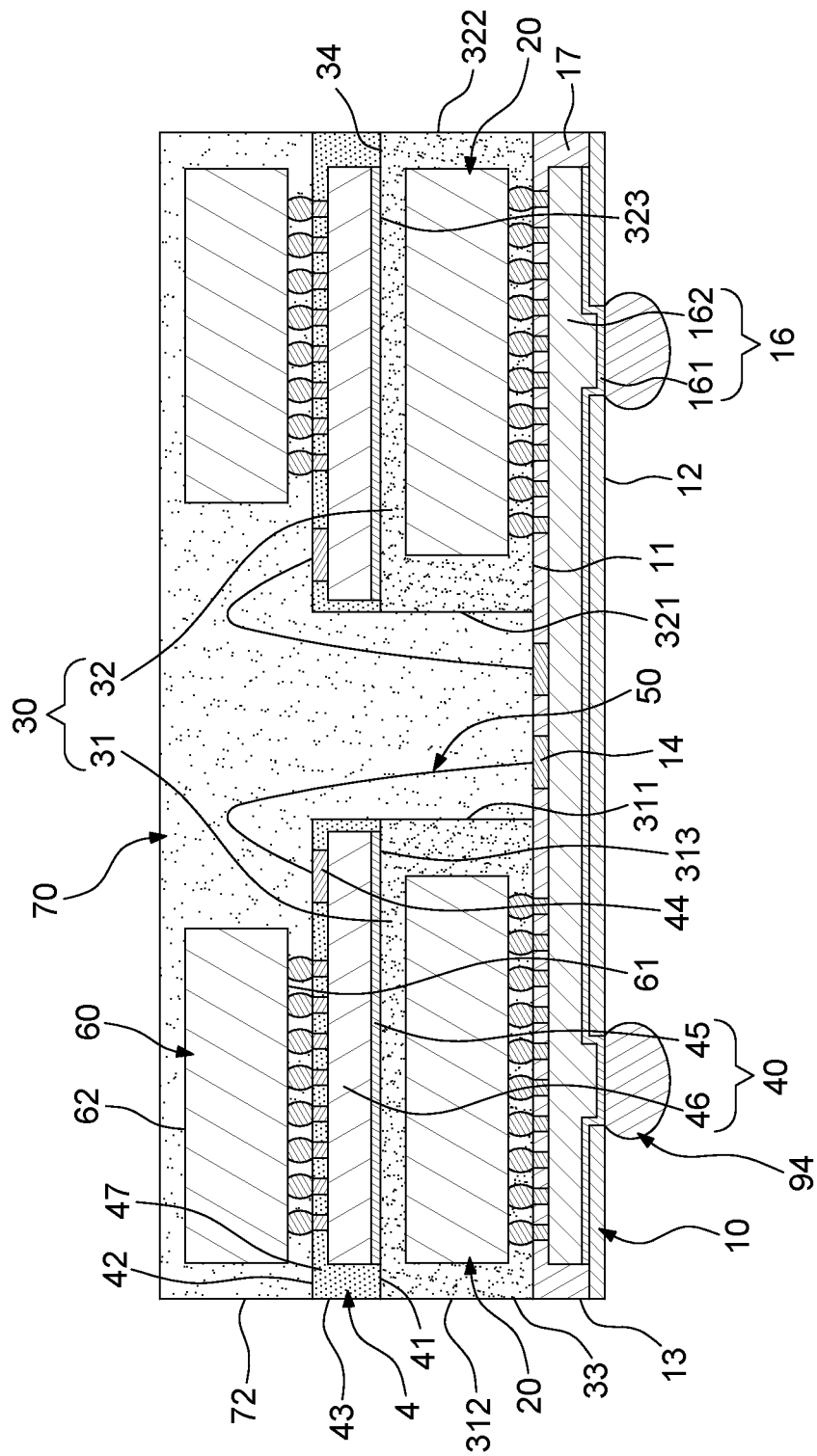
FIG. 35 illustrates one or more stages of an example of a method for manufacturing a semiconductor package structure according to some embodiments of the present disclosure.

FIG. 35 illustrate a method for manufacturing a semiconductor package structure according to some embodiments of the present disclosure. In some embodiments, the method is for manufacturing a semiconductor package structure such as the semiconductor package structure 1g shown in FIG. 8. The initial several stages of the illustrated process are the same as, or similar to, the stages illustrated in FIG. 10 through FIG. 24. FIG. 35 depicts a stage subsequent to that depicted in FIG. 24.

Referring to FIG. 35, a plurality of solder bumps 94 are formed or disposed on the conductive structure 10. Then, the solder bumps 94 are electrically connected to a substrate 95, so as to obtain the semiconductor package structure 1g of FIG. 8.

Figure 36:
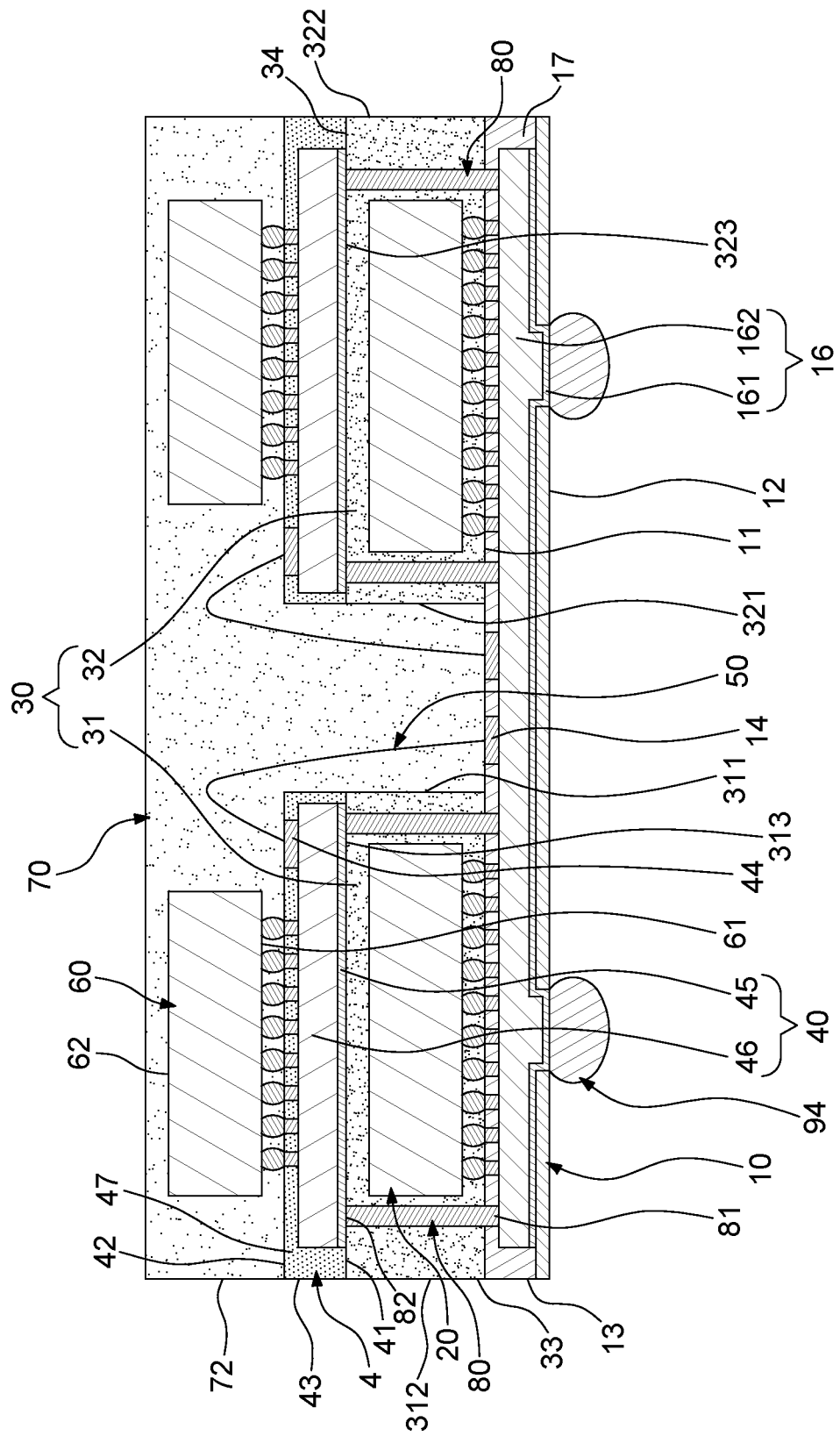
FIG. 36 illustrates one or more stages of an example of a method for manufacturing a semiconductor package structure according to some embodiments of the present disclosure.

FIG. 36 illustrate a method for manufacturing a semiconductor package structure according to some embodiments of the present disclosure. In some embodiments, the method is for manufacturing a semiconductor package structure such as the semiconductor package structure 1h shown in FIG. 9. The initial several stages of the illustrated process are the same as, or similar to, the stages illustrated in FIG. 10 through FIG. 16 and FIG. 25 through FIG. 34. FIG. 36 depicts a stage subsequent to that depicted in FIG. 34.

Referring to FIG. 36, a plurality of solder bumps 94 are formed or disposed on the conductive structure 10. Then, the solder bumps 94 are electrically connected to a substrate 95, so as to obtain the semiconductor package structure 1h of FIG. 9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
 a first conductive structure;
 a second conductive structure disposed under the first conductive structure;
 a first encapsulant connecting the first conductive structure with the second conductive structure;
 a second encapsulant disposed under the second conductive structure and spaced apart from the first encapsulant; and
 a third encapsulant disposed over the first conductive structure and contacting the first encapsulant.

2. The semiconductor package structure of claim 1, wherein a peripheral surface of the first conductive structure is substantially aligned with a peripheral surface of the third encapsulant.

3. The semiconductor package structure of claim 1, wherein a peripheral surface of the second conductive structure is substantially aligned with a peripheral surface of the first encapsulant.

4. The semiconductor package structure of claim 3, wherein the peripheral surface of the second conductive structure is substantially aligned with a peripheral surface of the second encapsulant.

5. The semiconductor package structure of claim 1, wherein a width of the first conductive structure is less than a width of the second conductive structure.

6. The semiconductor package structure of claim 1, further comprising a first die, a second die and a third die encapsulated by the first encapsulant, the second encapsulant and the third encapsulant, respectively.

* * * * *